United States Patent
DenBaars et al.

(10) Patent No.: US 7,781,789 B2
(45) Date of Patent: Aug. 24, 2010

(54) TRANSPARENT MIRRORLESS LIGHT EMITTING DIODE

(75) Inventors: Steven P. DenBaars, Goleta, CA (US); Shuji Nakamura, Santa Barbara, CA (US); James S. Speck, Goleta, CA (US)

(73) Assignee: The Regents of the University of California, Oakland, CA (US)

(*) Notice: Subject to any disclaimer, the term of this patent is extended or adjusted under 35 U.S.C. 154(b) by 27 days.

(21) Appl. No.: 11/940,898

(22) Filed: Nov. 15, 2007

(65) Prior Publication Data
US 2008/0128731 A1    Jun. 5, 2008

Related U.S. Application Data

(60) Provisional application No. 60/866,023, filed on Nov. 15, 2006.

(51) Int. Cl.
H01L 29/22 (2006.01)
H01L 29/227 (2006.01)
H01L 33/00 (2006.01)
H01L 29/24 (2006.01)
H01L 29/18 (2006.01)
H01L 21/00 (2006.01)

(52) U.S. Cl. ............... 257/98; 257/88; 257/99; 257/100; 257/E25.028; 257/E25.032; 257/E33.001; 257/E33.065; 257/E33.066; 257/E33.068; 257/E33.074; 257/E33.064; 438/34; 438/35

(58) Field of Classification Search ............... 257/88, 257/98–100, E25.028, E25.032, E33.001, 257/E33.064, E33.065, E33.068, E33.074, 257/E33.066; 438/34–35
See application file for complete search history.

(56) References Cited

U.S. PATENT DOCUMENTS 4,497,974 A * 2/1985 Deckman et al. ............ 136/259

(Continued)

FOREIGN PATENT DOCUMENTS

EP    1081771 A2    3/2001

(Continued)

OTHER PUBLICATIONS

Fujii, T. et al., "Increase in the extraction efficiency of GaN-based light-emitting diodes via surface roughening," Appl. Phys. Lett., Feb. 9, 2004, pp. 855-857, vol. 84, No. 6.

(Continued)

*Primary Examiner*—Ida M Soward
(74) *Attorney, Agent, or Firm*—Gates & Cooper LLP

(57) ABSTRACT

An (Al, Ga, In)N light emitting diode (LED) in which multi-directional light can be extracted from one or more surfaces of the LED before entering a shaped optical element and subsequently being extracted to air. In particular, the (Al, Ga, In)N and transparent contact layers (such as ITO or ZnO) are embedded in or combined with a shaped optical element, which may be an epoxy, glass, silicon or other material molded into a sphere or inverted cone shape, wherein most of the light entering the inverted cone shape lies within a critical angle and is extracted. The present invention also minimizes internal reflections within the LED by eliminating mirrors and/or mirrored surfaces, in order to minimize re-absorption of the LED's light by the emitting layer (or the active layer) of the LED. To assist in minimizing internal reflections, transparent electrodes, such as ITO or ZnO, may be used. Surface roughening by patterning or anisotropically etching (i.e., creating microcones) may also assist in light extraction, as well as minimizing internal reflections.

56 Claims, 15 Drawing Sheets

U.S. PATENT DOCUMENTS

| | | | |
|---|---|---|---|
| 6,155,699 | A | 12/2000 | Miller et al. |
| 6,357,889 | B1 | 3/2002 | Duggal et al. |
| 6,452,217 | B1 * | 9/2002 | Wojnarowski et al. ........ 257/99 |
| 6,548,956 | B2 * | 4/2003 | Forrest et al. ................ 313/504 |
| 6,686,218 | B2 * | 2/2004 | Lin et al. ...................... 438/29 |
| 6,729,746 | B2 * | 5/2004 | Suehiro et al. .............. 362/241 |
| 6,746,295 | B2 | 6/2004 | Sorg |
| 7,126,159 | B2 * | 10/2006 | Itai et al. ...................... 257/91 |
| 7,250,728 | B2 * | 7/2007 | Chen et al. ............... 315/169.1 |
| 7,253,447 | B2 * | 8/2007 | Oishi et al. ................... 257/99 |
| 2004/0211970 | A1 | 10/2004 | Hayashimoto et al. |
| 2005/0032257 | A1 | 2/2005 | Camras et al. |
| 2005/0121688 | A1 * | 6/2005 | Nagai et al. ................... 257/99 |
| 2005/0133810 | A1 | 6/2005 | Roberts et al. |
| 2005/0156510 | A1 | 7/2005 | Chua et al. |
| 2006/0138439 | A1 * | 6/2006 | Bogner et al. ................. 257/98 |
| 2006/0186418 | A1 | 8/2006 | Edmond et al. |
| 2006/0237732 | A1 * | 10/2006 | Nagai et al. ................... 257/91 |
| 2007/0120135 | A1 * | 5/2007 | Soules et al. .................. 257/98 |
| 2008/0191191 | A1 * | 8/2008 | Kim ............................ 257/13 |

FOREIGN PATENT DOCUMENTS

| | | |
|---|---|---|
| WO | 2005083037 A1 | 9/2005 |

OTHER PUBLICATIONS

Jasinski, J. et al., "Microstructure of GaAs/GaN interfaces produced by direct wafer fusion," Appl. Lett., Oct. 21, 2002, pp. 3152-3154, vol. 81, No. 17.

Kish, F.A. et al., "Very high-efficiency semiconductor wafer-bonded transparent-substrate $(Al_xG_{z1-x})0.5In0.5P/GaP$ light-emitting diodes," Appl. Phys. Lett., May 23, 1994, pp. 2839-2841, vol. 64, No. 21.

Liau, Z.L. et al., "Wafer fusion: A novel technique for optoelectronic device fabrication and monolithic integration," Appl. Phys. Lett., Feb. 19, 1990, pp. 737-739, vol. 56, No. 8.

Murai, A. et al., "Wafer Bonding of GaN and ZnSSe for Optoelectronic Applications," Jpn. J. Appl. Phys., 2004, pp. L1275-L1277, vol. 43, No. 10A.

Nakahara, K. et al., "Improved External Efficiency InGaN-Based Light-Emitting Diodes with Transparent Conductive Ga-Doped Zn0 as p-Electrodes," Jpn. J. Appl. Phys., 2004, pp. L180-L182, vol. 43, No. 2A.

Nakamura, S. et al., "High-Brightness InGaN Blue, Green and Yellow Light-Emitting Diodes with Quantum Well Structures," Jpn. J. Appl. Phys., Jul. 1, 1995, pp. L797-L799, vol. 34, Part 2, No. 7A.

Narukawa, Y. et al., "Ultra-High Efficiency White Light Emitting Diodes," Jpn. J. Appl. Phys., 2006, pp. L1084-L1086, vol. 45, No. 41.

International Search Report mailed Nov. 1, 2007.

* cited by examiner

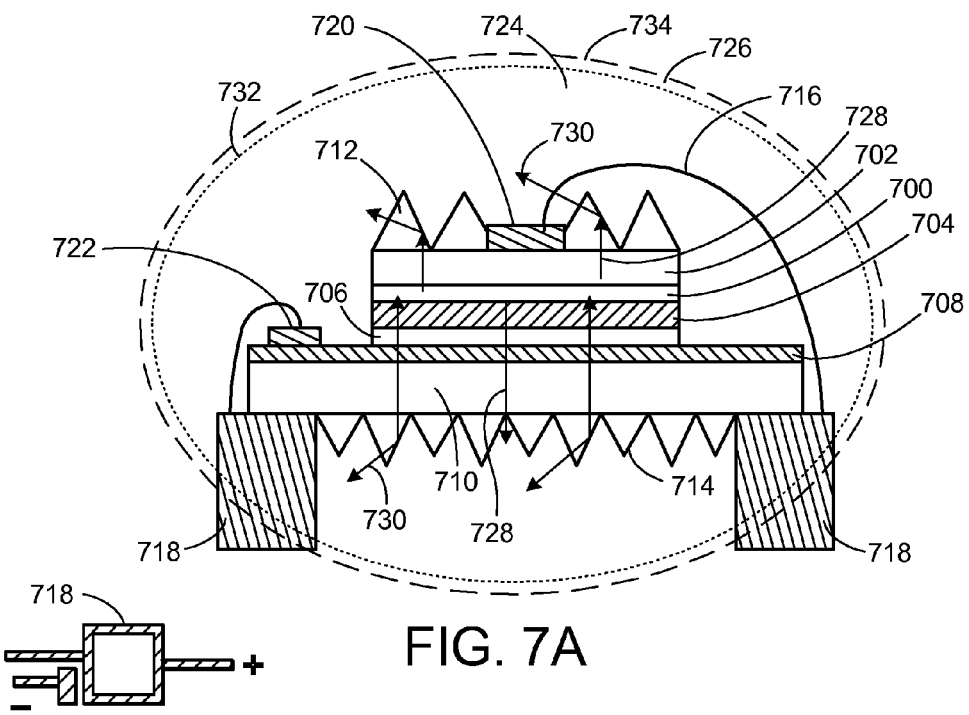
FIG. 7A
FIG. 7B
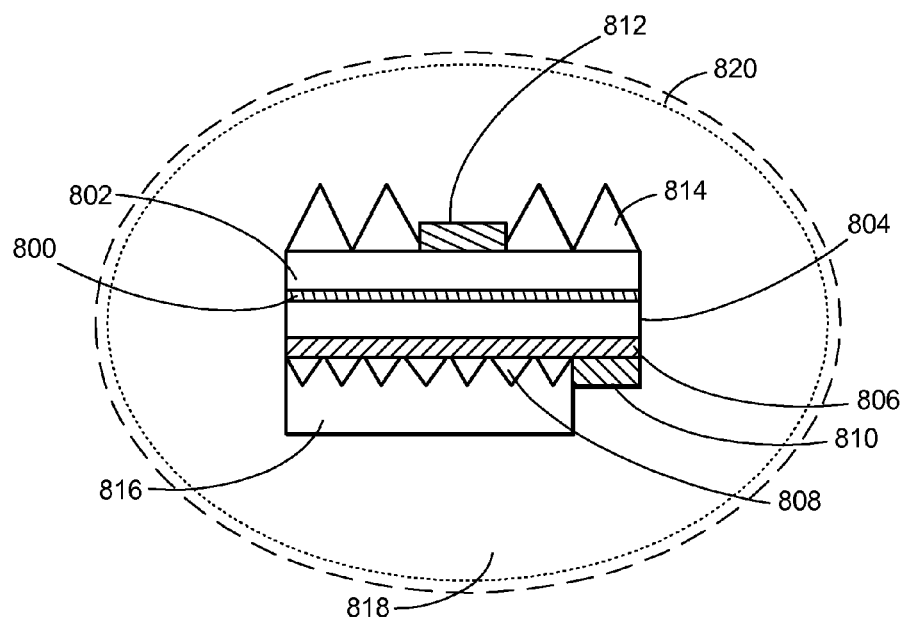
FIG. 8

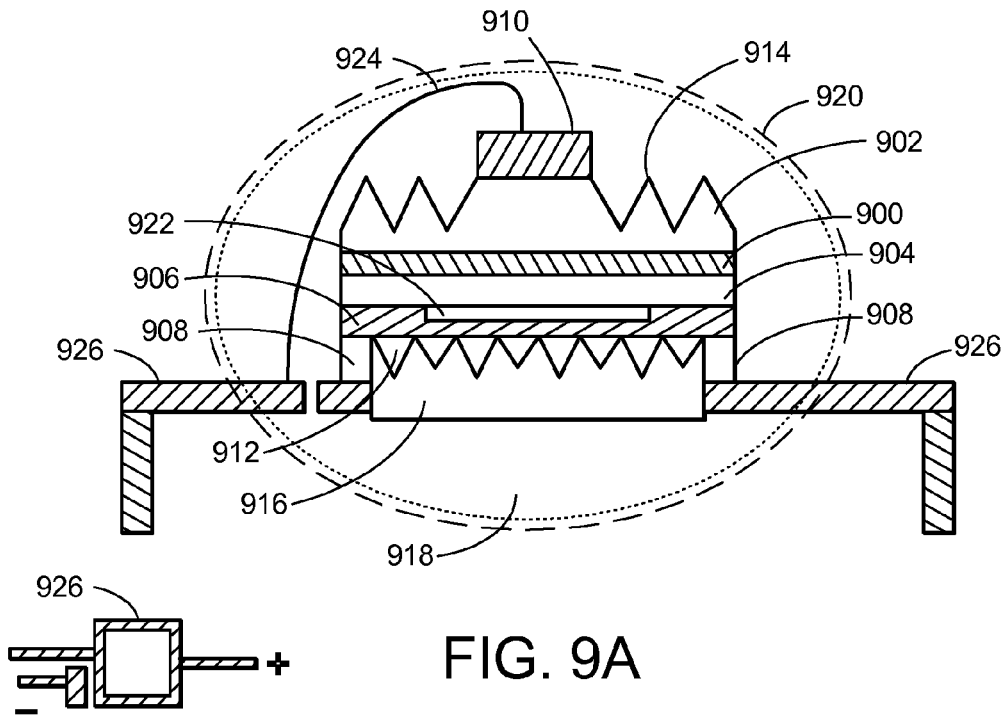
FIG. 9A
FIG. 9B
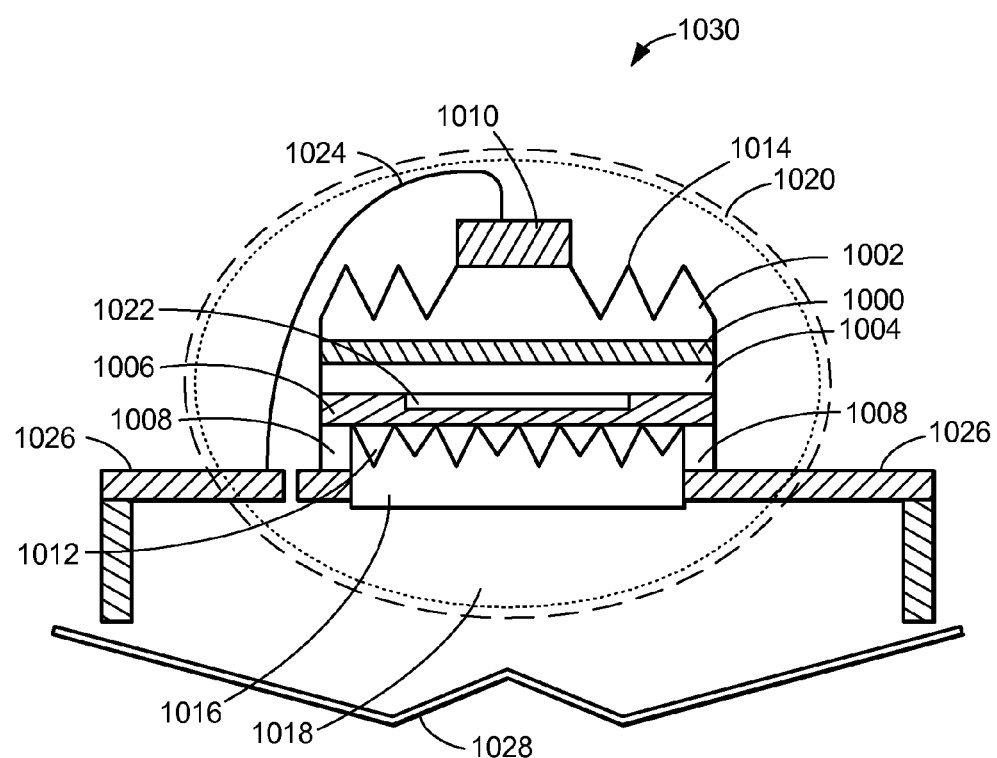
FIG. 10

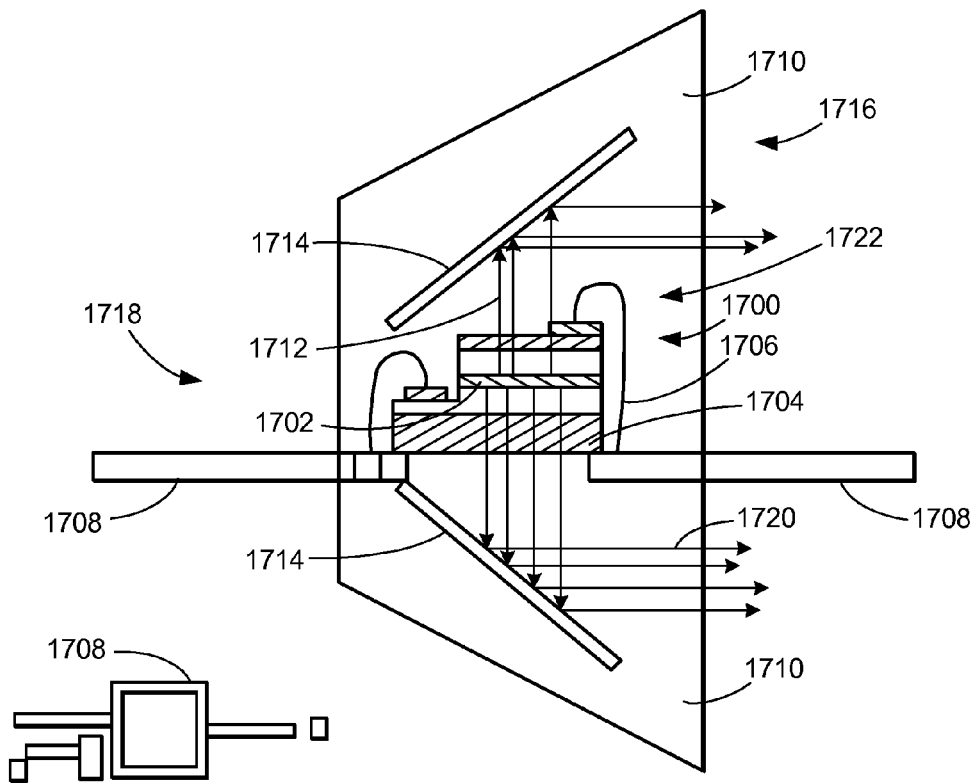
FIG. 17B
FIG. 17A
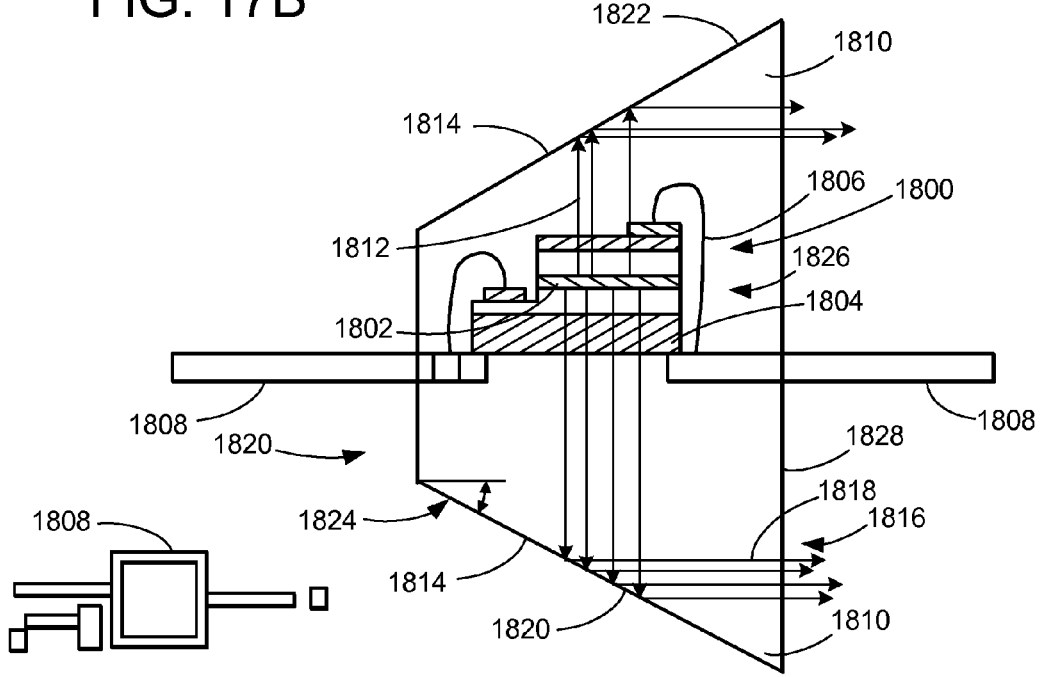
FIG. 18B
FIG. 18A

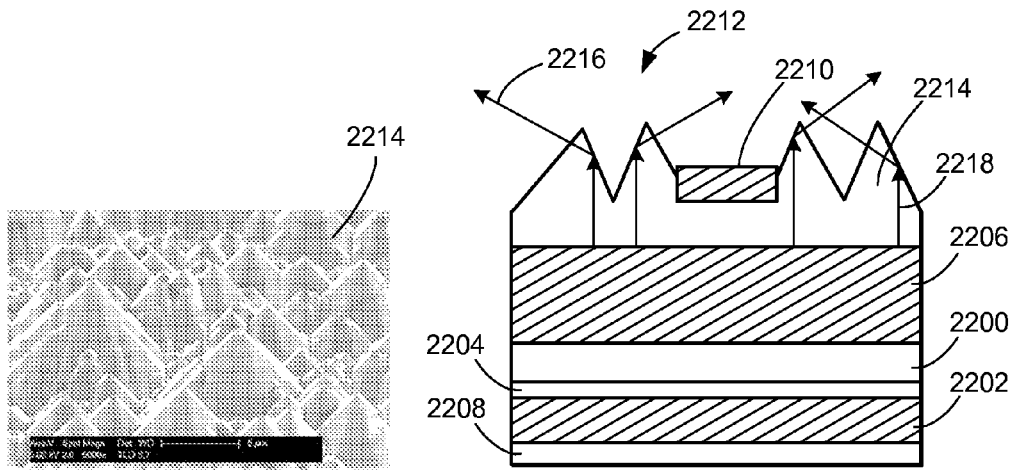
FIG. 22B
FIG. 22A
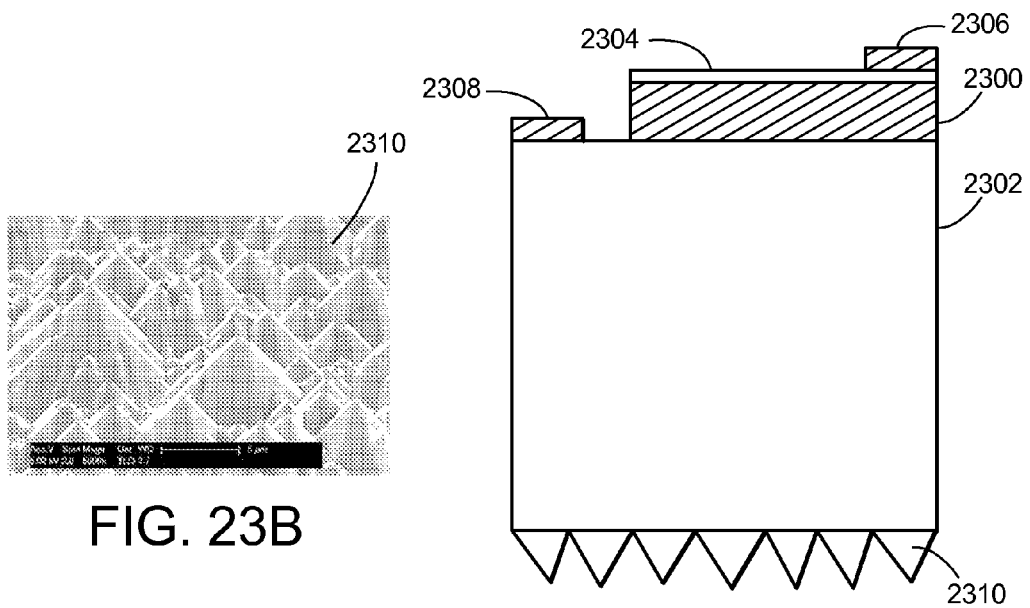
FIG. 23B
FIG. 23A

TRANSPARENT MIRRORLESS LIGHT EMITTING DIODE

CROSS-REFERENCE TO RELATED APPLICATIONS

This application claims the benefit under 35 U.S.C. Section 119(e) of the following co-pending and commonly-assigned U.S. patent application:

U.S. Provisional Patent Application Ser. No. 60/866,023, filed on Nov. 15, 2006, by Steven P. DenBaars, Shuji Nakamura and James S. Speck, entitled "TRANSPARENT MIRROR-LESS (TML) LIGHT EMITTING DIODE,";

which application is incorporated by reference herein.

This application is related to the following co-pending and commonly-assigned applications:

U.S. Utility application Ser. No. 10/581,940, filed on Jun. 7, 2006, by Tetsuo Fujii, Yan Gao, Evelyn L. Hu, and Shuji Nakamura, entitled "HIGHLY EFFICIENT GALLIUM NITRIDE BASED LIGHT EMITTING DIODES VIA SURFACE ROUGHENING," which application claims the benefit under 35 U.S.C Section 365(c) of PCT Application Serial No. US2003/03921, filed on Dec. 9, 2003, by Tetsuo Fujii, Yan Gao, Evelyn L. Hu, and Shuji Nakamura, entitled "HIGHLY EFFICIENT GALLIUM NITRIDE BASED LIGHT EMITTING DIODES VIA SURFACE ROUGHENING,";

U.S. Utility application Ser. No. 11/054,271, filed on Feb. 9, 2005, by Rajat Sharma, P. Morgan Pattison, John F. Kaeding, and Shuji Nakamura, entitled "SEMICONDUCTOR LIGHT EMITTING DEVICE,";

U.S. Utility application Ser. No. 11/175,761, filed on Jul. 6, 2005, by Akihiko Murai, Lee McCarthy, Umesh K. Mishra and Steven P. DenBaars, entitled "METHOD FOR WAFER BONDING (Al, In, Ga)N and Zn(S, Se) FOR OPTOELECTRONICS APPLICATIONS," which application claims the benefit under 35 U.S.C Section 119(e) of U.S. Provisional Application Ser. No. 60/585,673, filed Jul. 6, 2004, by Akihiko Murai, Lee McCarthy, Umesh K. Mishra and Steven P. DenBaars, entitled "METHOD FOR WAFER BONDING (Al, In, Ga)N and Zn(S, Se) FOR OPTOELECTRONICS APPLICATIONS,";

U.S. Utility application Ser. No. 11/067,957, filed Feb. 28, 2005, by Claude C. A. Weisbuch, Aurelien J. F. David, James S. Speck and Steven P. DenBaars, entitled "HORIZONTAL EMITTING, VERTICAL EMITTING, BEAM SHAPED, DISTRIBUTED FEEDBACK (DFB) LASERS BY GROWTH OVER A PATTERNED SUBSTRATE,";

U.S. Utility application Ser. No. 11/923,414, filed Oct. 24, 2007, by Claude C. A. Weisbuch, Aurelien J. F. David, James S. Speck and Steven P. DenBaars, entitled "SINGLE OR MULTI-COLOR HIGH EFFICIENCY LIGHT EMITTING DIODE (LED) BY GROWTH OVER A PATTERNED SUBSTRATE," which application is a continuation of U.S. Pat. No. 7,291,864, issued Nov. 6, 2007, to Claude C. A. Weisbuch, Aurelien J. F. David, James S. Speck and Steven P. DenBaars, entitled "SINGLE OR MULTI-COLOR HIGH EFFICIENCY LIGHT EMITTING DIODE (LED) BY GROWTH OVER A PATTERNED SUBSTRATE,";

U.S. Utility application Ser. No. 11/067,956, filed Feb. 28, 2005, by Aurelien J. F. David, Claude C. A Weisbuch and Steven P. DenBaars, entitled "HIGH EFFICIENCY LIGHT EMITTING DIODE (LED) WITH OPTIMIZED PHOTONIC CRYSTAL EXTRACTOR,";

U.S. Utility application Ser. No. 11/403,624, filed Apr. 13, 2006, by James S. Speck, Troy J. Baker and Benjamin A. Haskell, entitled "WAFER SEPARATION TECHNIQUE FOR THE FABRICATION OF FREE-STANDING (AL, IN, GA)N WAFERS," which application claims the benefit under 35 U.S.C Section 119(e) of U.S. Provisional Application Ser. No. 60/670,810, filed Apr. 13, 2005, by James S. Speck, Troy J. Baker and Benjamin A. Haskell, entitled "WAFER SEPARATION TECHNIQUE FOR THE FABRICATION OF FREE-STANDING (AL, IN, GA)N WAFERS,";

U.S. Utility application Ser. No. 11/403,288, filed Apr. 13, 2006, by James S. Speck, Benjamin A. Haskell, P. Morgan Pattison and Troy J. Baker, entitled "ETCHING TECHNIQUE FOR THE FABRICATION OF THIN (AL, IN, GA)N LAYERS," which application claims the benefit under 35 U.S.C Section 119(e) of U.S. Provisional Application Ser. No. 60/670,790, filed Apr. 13, 2005, by James S. Speck, Benjamin A. Haskell, P. Morgan Pattison and Troy J. Baker, entitled "ETCHING TECHNIQUE FOR THE FABRICATION OF THIN (AL, IN, GA)N LAYERS,";

U.S. Utility application Ser. No. 11/454,691, filed on Jun. 16, 2006, by Akihiko Murai, Christina Ye Chen, Daniel B. Thompson, Lee S. McCarthy, Steven P. DenBaars, Shuji Nakamura, and Umesh K. Mishra, entitled "(Al, Ga, In)N AND ZnO DIRECT WAFER BONDING STRUCTURE FOR OPTOELECTRONIC APPLICATIONS AND ITS FABRICATION METHOD," which application claims the benefit under 35 U.S.C Section 119(e) of U.S. Provisional Application Ser. No. 60/691,710, filed on Jun. 17, 2005, by Akihiko Murai, Christina Ye Chen, Lee S. McCarthy, Steven P. DenBaars, Shuji Nakamura, and Umesh K. Mishra, entitled "(Al, Ga, In)N AND ZnO DIRECT WAFER BONDING STRUCTURE FOR OPTOELECTRONIC APPLICATIONS, AND ITS FABRICATION METHOD," U.S. Provisional Application Ser. No. 60/732,319, filed on Nov. 1, 2005, by Akihiko Murai, Christina Ye Chen, Daniel B. Thompson, Lee S. McCarthy, Steven P. DenBaars, Shuji Nakamura, and Umesh K. Mishra, entitled "(Al, Ga, In)N AND ZnO DIRECT WAFER BONDED STRUCTURE FOR OPTOELECTRONIC APPLICATIONS, AND ITS FABRICATION METHOD," and U.S. Provisional Application Ser. No. 60/764,881, filed on Feb. 3, 2006, by Akihiko Murai, Christina Ye Chen, Daniel B. Thompson, Lee S. McCarthy, Steven P. DenBaars, Shuji Nakamura, and Umesh K. Mishra, entitled "(Al, Ga, In)N AND ZnO DIRECT WAFER BONDED STRUCTURE FOR OPTOELECTRONIC APPLICATIONS AND ITS FABRICATION METHOD,";

U.S. Utility application Ser. No. 11/251,365 filed Oct. 14, 2005, by Frederic S. Diana, Aurelien J. F. David, Pierre M. Petroff, and Claude C. A. Weisbuch, entitled "PHOTONIC STRUCTURES FOR EFFICIENT LIGHT EXTRACTION AND CONVERSION IN MULTI-COLOR LIGHT EMITTING DEVICES,";

U.S. Utility application Ser. No. 11/633,148, filed Dec. 4, 2006, Claude C. A. Weisbuch and Shuji Nakamura, entitled "IMPROVED HORIZONTAL EMITTING, VERTICAL EMITTING, BEAM SHAPED, DISTRIBUTED FEEDBACK (DFB) LASERS FABRICATED BY GROWTH OVER A PATTERNED SUBSTRATE WITH MULTIPLE OVERGROWTH," which application claims the benefit under 35 U.S.C Section 119(e) of U.S. Provisional Application Ser. No. 60/741,935, filed Dec. 2, 2005, Claude C. A. Weisbuch and Shuji Nakamura, entitled "IMPROVED HORIZONTAL EMITTING, VERTICAL EMITTING, BEAM SHAPED, DFB LASERS FABRICATED BY GROWTH OVER PATTERNED SUBSTRATE WITH MULTIPLE OVERGROWTH,";

U.S. Utility application Ser. No. 11/593,268, filed on Nov. 6, 2006, by Steven P. DenBaars, Shuji Nakamura, Hisashi Masui, Natalie N. Fellows, and Akihiko Murai, entitled "HIGH LIGHT EXTRACTION EFFICIENCY LIGHT EMITTING DIODE (LED)," which application claims the benefit under 35 U.S.C Section 119(e) of U.S. Provisional Application Ser. No. 60/734,040, filed on Nov. 4, 2005, by Steven P. DenBaars, Shuji Nakamura, Hisashi Masui, Natalie N. Fellows, and Akihiko Murai, entitled "HIGH LIGHT EXTRACTION EFFICIENCY LIGHT EMITTING DIODE (LED),";

U.S. Utility application Ser. No. 11/608,439, filed on Dec. 8, 2006, by Steven P. DenBaars, Shuji Nakamura and James S. Speck, entitled "HIGH EFFICIENCY LIGHT EMITTING DIODE (LED)," which application claims the benefit under 35 U.S.C Section 119(e) of U.S. Provisional Application Ser. No. 60/748,480, filed on Dec. 8, 2005, by Steven P. DenBaars, Shuji Nakamura and James S. Speck, entitled "HIGH EFFICIENCY LIGHT EMITTING DIODE (LED)," and U.S. Provisional Application Ser. No. 60/764,975, filed on Feb. 3, 2006, by Steven P. DenBaars, Shuji Nakamura and James S. Speck, entitled "HIGH EFFICIENCY LIGHT EMITTING DIODE (LED),";

U.S. Utility application Ser. No. 11/676,999, filed on Feb. 20, 2007, by Hong Zhong, John F. Kaeding, Rajat Sharma, James S. Speck, Steven P. DenBaars and Shuji Nakamura, entitled "METHOD FOR GROWTH OF SEMIPOLAR (Al, In, Ga, B)N OPTOELECTRONIC DEVICES," which application claims the benefit under 35 U.S.C Section 119(e) of U.S. Provisional Application Ser. No. 60/774,467, filed on Feb. 17, 2006, by Hong Zhong, John F. Kaeding, Rajat Sharma, James S. Speck, Steven P. DenBaars and Shuji Nakamura, entitled "METHOD FOR GROWTH OF SEMIPOLAR (Al, In, Ga, B)N OPTOELECTRONIC DEVICES,";

U.S. Utility patent application Ser. No. 11/940,848, filed on Nov. 15, 2007, by Aurelien J. F. David, Claude C. A. Weisbuch and Steven P. DenBaars entitled "HIGH LIGHT EXTRACTION EFFICIENCY LIGHT EMITTING DIODE (LED) THROUGH MULTIPLE EXTRACTORS," which application claims the benefit under 35 U.S.C Section 119(e) of U.S. Provisional Patent Application Ser. No. 60/866,014, filed on Nov. 15, 2006, by Aurelien J. F. David, Claude C. A. Weisbuch and Steven P. DenBaars entitled "HIGH LIGHT EXTRACTION EFFICIENCY LIGHT EMITTING DIODE (LED) THROUGH MULTIPLE EXTRACTORS," and U.S. Provisional Patent Application Ser. No. 60/883,977, filed on Jan. 8, 2007, by Aurelien J. F. David, Claude C. A. Weisbuch and Steven P. DenBaars entitled "HIGH LIGHT EXTRACTION EFFICIENCY LIGHT EMITTING DIODE (LED) THROUGH MULTIPLE EXTRACTORS,";

U.S. utility patent application Ser. No. 11/940,853, filed on Nov. 15, 2007, by Claude C. A. Weisbuch, James S. Speck and Steven P. DenBaars entitled "HIGH EFFICIENCY WHITE, SINGLE OR MULTI-COLOUR LED BY INDEX MATCHING STRUCTURES," which application claims the benefit under 35 U.S.C Section 119(e) of U.S. Provisional Patent Application Ser. No. 60/866,026, filed on Nov. 15, 2006, by Claude C. A. Weisbuch, James S. Speck and Steven P. DenBaars entitled "HIGH EFFICIENCY WHITE, SINGLE OR MULTI-COLOUR LED BY INDEX MATCHING STRUCTURES,";

U.S. Utility patent application Ser. No. 11/940,866, filed on same date herewith, by Aurelien J. F. David, Claude C. A. Weisbuch, Steven P. DenBaars and Stacia Keller, entitled "HIGH LIGHT EXTRACTION EFFICIENCY LIGHT EMITTING DIODE (LED) WITH EMITTERS WITHIN STRUCTURED MATERIALS," which application claims the benefit under 35 U.S.C Section 119(e) of U.S. Provisional patent application Ser. No. 60/866,015, filed on same date herewith, by Aurelien J. F. David, Claude C. A. Weisbuch, Steven P. DenBaars and Stacia Keller, entitled "HIGH LIGHT EXTRACTION EFFICIENCY LED WITH EMITTERS WITHIN STRUCTURED MATERIALS,";

U.S. Utility patent application Ser. No. 11/940,876, filed on Nov. 15, 2007, by Evelyn L. Hu, Shuji Nakamura, Yong Seok Choi, Rajat Sharma and Chiou-Fu Wang, entitled "ION BEAM TREATMENT FOR THE STRUCTURAL INTEGRITY OF AIR-GAP III-NITRIDE DEVICES PRODUCED BY PHOTOELECTROCHEMICAL (PEC) ETCHING," which application claims the benefit under 35 U.S.C Section 119(e) of U.S. Provisional Patent Application Ser. No. 60/866,027, filed on Nov. 15, 2006, by Evelyn L. Hu, Shuji Nakamura, Yong Seok Choi, Rajat Sharma and Chiou-Fu Wang, entitled "ION BEAM TREATMENT FOR THE STRUCTURAL INTEGRITY OF AIR-GAP III-NITRIDE DEVICES PRODUCED BY PHOTOELECTROCHEMICAL (PEC) ETCHING,";

U.S. Utility patent application Ser. No. 11/940,885, filed on Nov. 15, 2007, by Natalie N. Fellows, Steven P. DenBaars and Shuji Nakamura, entitled "TEXTURED PHOSPHOR CONVERSION LAYER LIGHT EMITTING DIODE," which application claims the benefit under 35 U.S.C Section 119(e) of U.S. Provisional Patent Application Ser. No. 60/866,024, filed on Nov. 15, 2006, by Natalie N. Fellows, Steven P. DenBaars and Shuji Nakamura, entitled "TEXTURED PHOSPHOR CONVERSION LAYER LIGHT EMITTING DIODE,";

U.S. Utility patent application Ser. No. 11/940,872, filed on Nov. 15, 2007, by Steven P. DenBaars, Shuji Nakamura and Hisashi Masui, entitled "HIGH LIGHT EXTRACTION EFFICIENCY SPHERE LED," (2007-271-2), which application claims the benefit under 35 U.S.C Section 119(e) of U.S. Provisional Patent Application Ser. No. 60/866,025, filed on Nov. 15, 2006, by Steven P. DenBaars, Shuji Nakamura and Hisashi Masui, entitled "HIGH LIGHT EXTRACTION EFFICIENCY SPHERE LED,"; and U.S. Utility patent application Ser. No. 11/940,883, filed on Nov. 15, 2007, by Shuji Nakamura and Steven P. DenBaars, entitled "STANDING TRANSPARENT MIRRORLESS (STML) LIGHT EMITTING DIODE," which application claims the benefit under 35 U.S.C Section 119(e) of U.S. Provisional Patent Application Ser. No. 60/866,017, filed on Nov. 15, 2006, by Shuji Nakamura and Steven P. DenBaars, entitled "STANDING TRANSPARENT MIRROR-LESS (STML) LIGHT EMITTING DIODE,";

all of which applications are incorporated by reference herein.

BACKGROUND OF THE INVENTION

1. Field of the Invention

The present invention is related to light extraction from light emitting diodes (LEDs).

2. Description of the Related Art (Note: This application references a number of different publications as indicated throughout the specification. In addition, a list of a number of different publications can be found below in the section entitled "References." Each of these publications is incorporated by reference herein.)

In a conventional LED, in order to increase the light output power from the front side of the LED, the emitted light is reflected by a mirror placed on the backside of the substrate or is reflected by a mirror coating on the lead frame, even if there are no mirrors on the backside of the sapphire substrate, and even if the bonding material is transparent at the emission wavelength. However, this reflected light is re-absorbed by the emitting layer (active layer), because the photon energy is almost same as the band-gap energy of the light emitting species, such as AlInGaN multi-quantum wells (MQWs). The efficiency or output power of the LEDs is decreased due to this re-absorption of the LED light by the emitting layer. See, for example, FIGS. 1, 2 and 3, which are described in more detail below. See also J. J. Appl. Phys. 34, L797-99 (1995) and J. J. Appl. Phys. 43, L180-82 (2004).

What is needed in the art are LED structures that more effectively extract light. The present invention satisfies that need.

SUMMARY OF THE INVENTION

The present invention describes an (Al, Ga, In)N light emitting diode (LED) in which multi-directional light can be extracted from one or more surfaces of the LED. Moreover, light may be extracted from multiple sides of the LED, namely the top (front) and bottom (back) sides of the LED.

The LED may be embedded in or combined with a shaped optical element comprising an epoxy, glass, silicon or other transparent material molded into a sphere, inverted cone or other shape.

The shaped optical element may be shaped, patterned, textured or roughened to increase the light extraction. In addition, a phosphor layer may be located on or in the shaped optical element, wherein the phosphor layer is shaped, patterned, textured or roughened to increase the light extraction.

The LED may reside on a transparent plate in a lead frame that allows the light to be extracted from multiple sides of the LED.

All layers of the LED may be transparent for an emission wavelength, except for an emitting layer. The present invention also minimizes internal reflections within the LED by eliminating mirrors and/or mirrored surfaces, in order to minimize re-absorption of the LED's light by the emitting layer (or the active layer) of the LED.

To assist in minimizing internal reflections, the LED may include one or more transparent contact layers, wherein the transparent contact layer is shaped, patterned, textured or roughened to increase the light extraction. Moreover, a current spreading layer may be deposited on the LED before the transparent contact layer. Further, the LED may include a transparent substrate, wherein the transparent substrate is shaped, patterned, textured or roughened to increase the light extraction.

BRIEF DESCRIPTION OF THE DRAWINGS

Referring now to the drawings in which like reference numbers represent corresponding parts throughout:

FIGS. 4-21 are schematic (cross-sectional) illustrations of LED structures according to the various embodiments of the present invention.

FIGS. 22 and 23 are cross-sectional schematic illustrations of LED structures grown using a bulk GaN, ZnO, SiC, Spinel, or other transparent material substrate.

DETAILED DESCRIPTION OF THE INVENTION

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

OVERVIEW

In the following description of the figures, the details of the LEDs structure are not shown. Only the emitting layer (usually AlInGaN MQW), p-type GaN, n-GaN and sapphire substrate are shown. Of course, there may be other layers in the LED structure, such as a p-AlGaN electron blocking layer, InGaN/GaN super lattices and others. In this invention, the most important aspects are the surfaces of the LED structure, because the light extraction efficiency is determined mainly by the surface layer or condition of the epitaxial wafers. Consequently, only some aspects (the surface layers) of the LED are shown in all of the figures.

Conventional LED Structures

Figure 1:
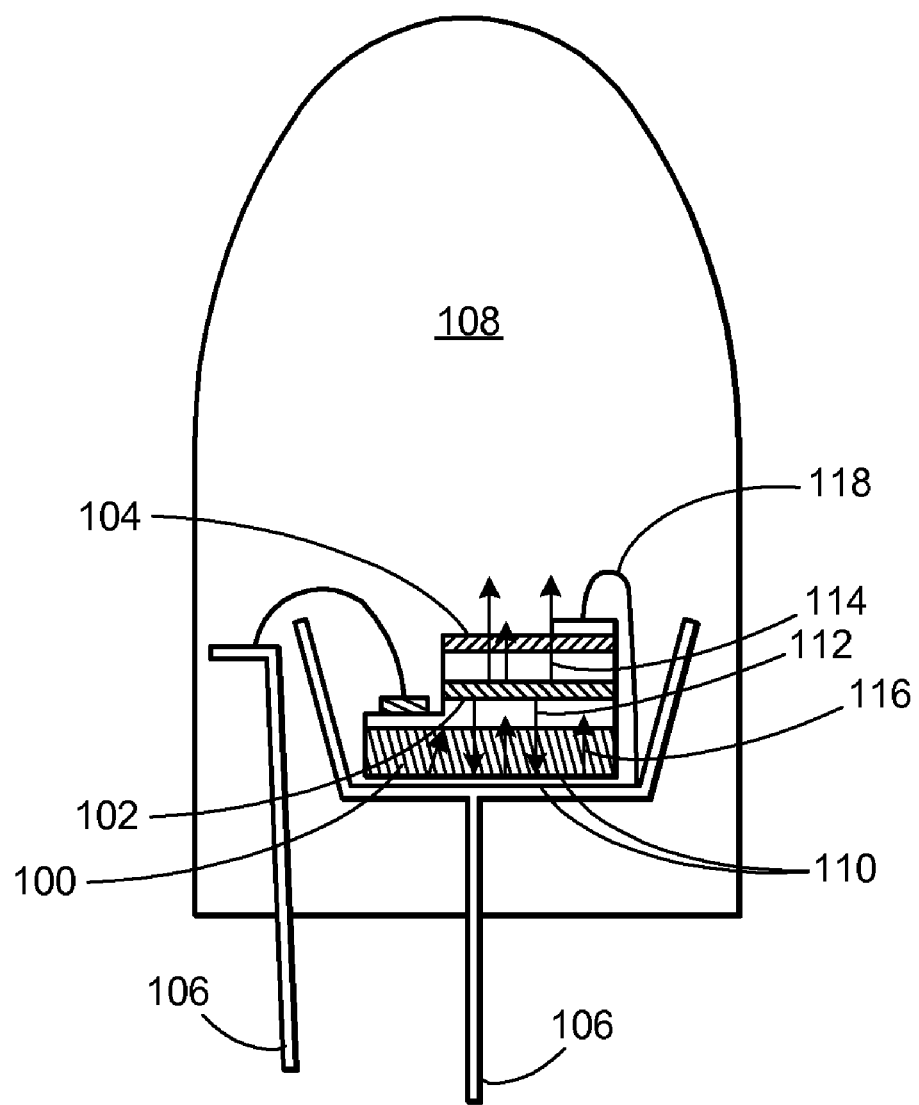
FIGS. 1, 2 and 3 are cross-sectional schematic illustrations of conventional LEDs.
Figure 2:
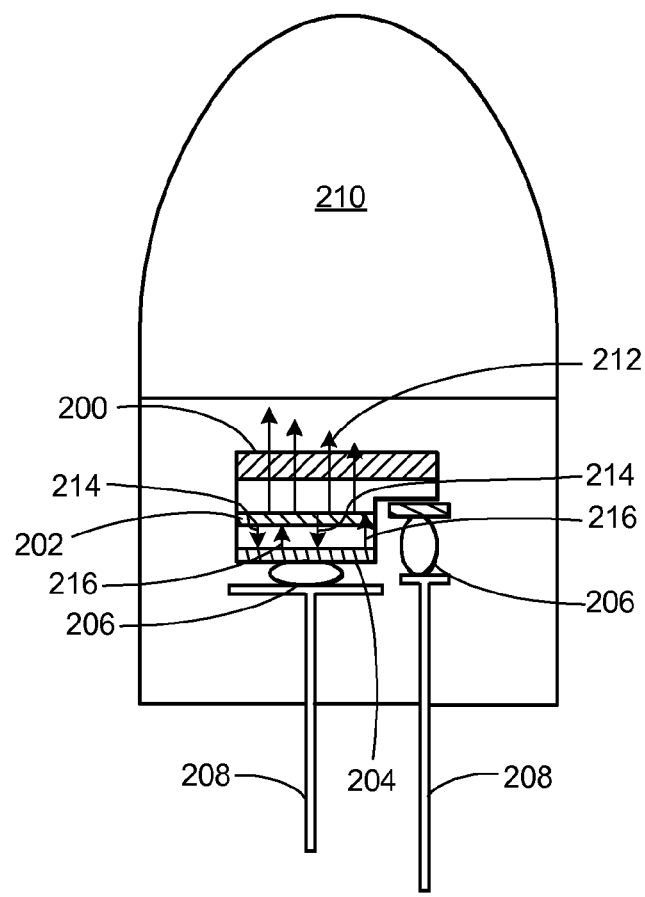
Figure 3:
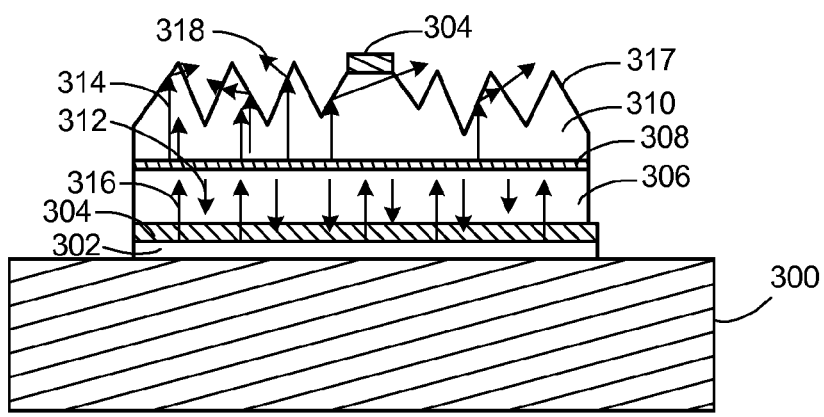

FIGS. 1, 2 and 3 are schematic illustrations of conventional LED structures.

In conventional LEDs, in order to increase the light output power from the front side of the LED, the emitting light is reflected by the mirror on the backside of the sapphire substrate or the mirror coating on the lead frame even if there is no mirrors on the backside of the sapphire substrate and even if the bonding material is transparent at the emission wavelength. This reflected light is re-absorbed by the emitting layer (active layer) because the photon energy is almost same as the band-gap energy of the active layer (e.g. quantum well of AlInGaN multi-quantum well (MQW)). Then, the efficiency or output power of the LEDs is decreased due to the re-absorption by the emitting layer.

In FIG. 1, a conventional LED includes a sapphire substrate 100, emitting layer 102 (active layer), and semi-transparent or transparent electrodes 104, such as ITO or ZnO. The LED is die-bonded on a lead frame 106 with a clear epoxy molding 108 without any mirror on the back side of the sapphire substrate 100. In this case, the coating material on the lead frame 106, or the surface of the lead frame 106, becomes a mirror 110. If there is a mirror 110 on the back side of the substrate 100, the LED chip is die-bonded using an Ag paste. The active layer 102 emits light 112 towards the substrate 100 and emits light 114 towards the electrodes 104. The emitting light 112 is reflected by the mirror 110 towards the electrode 104, becoming reflected light 116 which is transmitted by the electrode 104 to escape the LED. The LED is wire bonded 118 to the lead frame 106.

In FIG. 2, the conventional LED is similar to that shown in FIG. 1, except that it is a flip-chip LED. The LED includes a sapphire substrate 200 and emitting layer 202 (active layer), and a highly reflective mirror 204. The LED is die-bonded 206 onto a lead frame 208 and embedded in a clear epoxy molding 210. The active layer 202 emits light 212 towards the substrate 200 and emits light 214 towards the highly reflective mirror 204. The emitting light 214 is reflected by the mirror 204 towards the substrate 200, becoming reflected light 216 which is transmitted by the substrate 200 to escape the LED.

In FIG. 3, the conventional LED includes a conducting sub-mount 300, high reflectivity mirror 302 (with Ag>94% reflectivity (R)), a transparent ITO layer 304, a p-GaN layer 306, an emitting or active layer 308, and an n-GaN layer 310. The LED is shown without the epoxy molding, although similar molding may be used. The emitting layer 308 emits LED emissions 312 towards the mirror 302 and emits LED emissions 314 towards the n-GaN layer 310. The emission 312 of the emitting layer 308 is reflected by the mirror 302, where the reflective light emissions 316 are re-absorbed by the emitting layer 308. The efficiency of the LED is decreased due to this re-absorption. The n-GaN layer may be roughened 317 to enhance extraction 318 of LED emissions 314.

Improved LED Structures

FIGS. 4-25 are schematic illustrations of improved LED structures according to the preferred embodiments of the present invention. In these figures, a number of different opto-electronic devices are shown, each comprising an LED that emits light from multiple sides of the LED, e.g., the light is emitted from front and back sides of the LED.

The LED may be embedded in or combined with a shaped optical element comprising an epoxy, glass, silicon or other transparent material molded into a sphere, or inverted cone or other shape.

The shaped optical element may be shaped, patterned, textured or roughened to increase the light extraction. In addition, a phosphor layer may be located on or in the shaped optical element, wherein the phosphor layer is shaped, patterned, textured or roughened to increase the light extraction.

The LED may reside on a transparent plate in a lead frame that allows the light to be extracted from multiple sides of the LED.

All layers of the LED may be transparent for an emission wavelength, except for an emitting layer. In addition, the LED may include one or more transparent contact layers, wherein the transparent contact layer is shaped, patterned, textured or roughened to increase the light extraction. Moreover, a current spreading layer may be deposited on the LED before the transparent contact layer. Further, the LED may include a transparent substrate, wherein the transparent substrate is shaped, patterned, textured or roughened to increase the light extraction.

Specific LED Structures

Figure 4A:
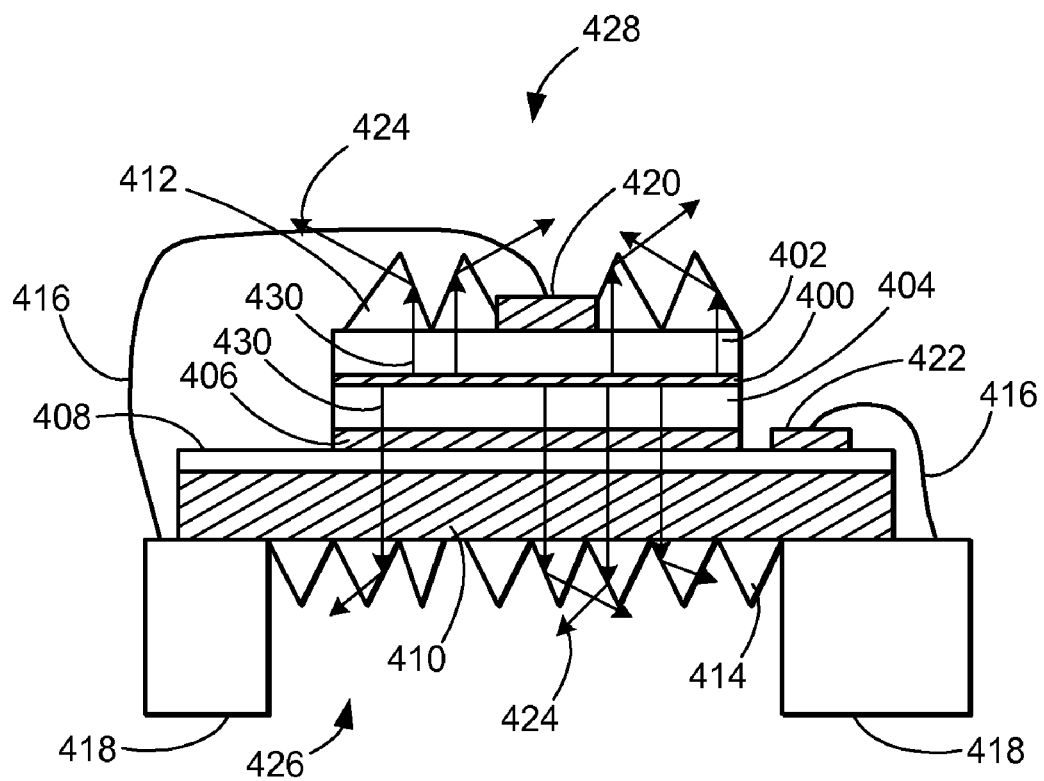

FIG. 4A is a schematic illustrating an LED comprising an emitting layer 400, an n-type GaN layer 402, a p-type GaN layer 404, an ITO layer 406, and a second ITO layer 408 on glass 410. The GaN of the LED has a roughened cone shaped surface 412 and the glass 410 has a roughened cone shaped surfaces 414. The LED is attached and wire bonded 416 to a lead frame 418 via the LED's bonding pads 420, 422.

Figure 4B:
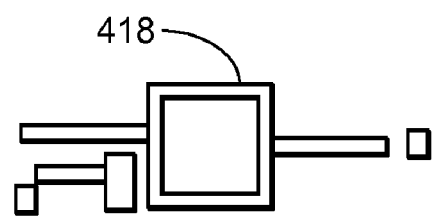

FIG. 4B shows a top view of the lead frame 418 and glass 410.

In FIG. 4, the LED structure is grown on a sapphire substrate. ITO 406 is deposited on the p-type GaN 404. ITO coated 408 glass 410 is attached to the ITO 406 using an epoxy as a glue. The other side 414 of the glass is then roughened by sandblasting. The sapphire substrate is removed using a laser de-bonding technique.

The nitrogen-face (N-face) GaN is etched with wet etching, such as KOH or HCL. A cone-shaped surface 412 is formed on the N-face GaN by etching.

The LED is placed on a lead frame 418, which works to remove heat from the LED. Wire bonding 416 is performed between the bonding pads 420, 422 of the LED and the lead frame 418 to flow a electric current through the lead frame 418.

There are no intentional mirrors at the front or back sides of the LED. Instead, the lead frame 418 is designed to effectively extract light 424 from both sides of the LED, because the frame 418 does not obstruct the surfaces 412 and 414, i.e., the back side 426 of the LED as well as the front side 428 of the LED. The LED emits light 426 which is extracted 424 by the surfaces 412, 414. FIG. 4B shows that the frame 418 supports the LED at the edges of the glass 410 leaving the emitting surface of the glass 410 and LED unobstructed.

An ohmic contact may be placed below the bonding pad of the n-GaN, but is not shown in the figure for simplicity.

The LED may be use without a mirror, as shown in FIGS. 7-20.

Figure 5:
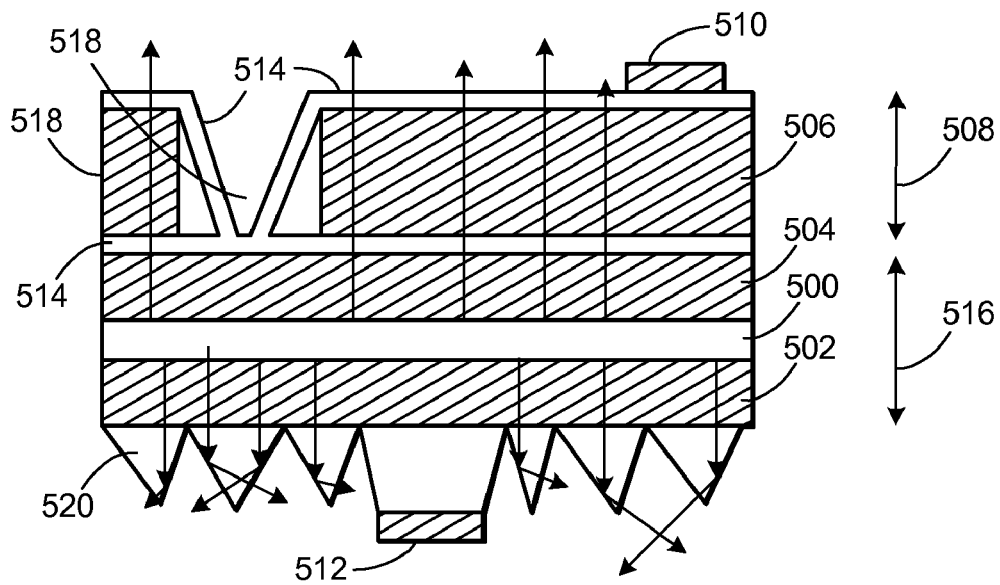

FIG. 5 is a schematic illustrating an LED comprising an InGaN multi quantum well active layer 500, an n-GaN layer 502, a p-GaN layer 504, an epoxy layer 506 (approximately 400 microns thick 508), a bonding pad 510, an ohmic electrode/bonding pad 512, and ITO or ZnO 514. The thickness 516 of the n-GaN 502, active layer 500 and p-GaN layer 504 is approximately 5 microns.

Figure 6:
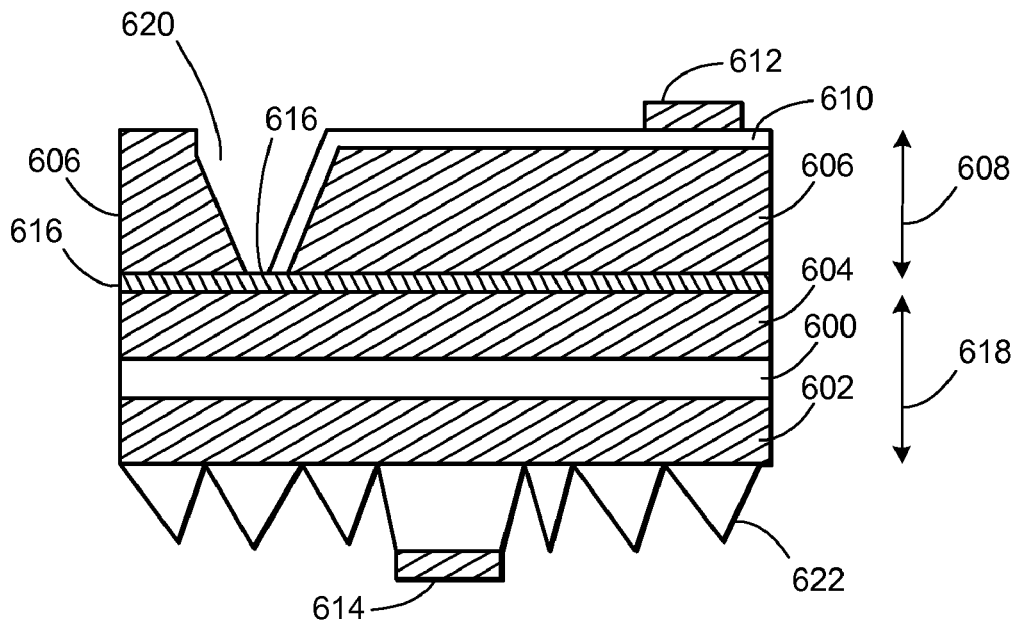

FIG. 6 is a schematic illustrating an LED comprising an InGaN multi quantum well active layer 600, an n-GaN layer 602, a p-GaN layer 604, an epoxy layer 606 (approximately 400 microns thick 608), a narrow stripe Au connection 610, a bonding pad 612, an ohmic electrode/bonding pad 614, and ITO or ZnO 616. The thickness 618 of the n-GaN 602, active layer 600 and p-GaN layer 604 is approximately 5 microns.

In FIGS. 5 and 6, a thick epoxy 506, 606 is used, rather than the glass 410 of FIG. 4. To make the electric contact, the epoxy 506, 606 is partially removed, and an ITO 514 or narrow stripe of Au 610 is deposited on the epoxy 506, 606, as well as within a hole or depression 518, 620 in the surface. Otherwise, the structure of FIG. 5 is the same as that shown in FIG. 4.

In FIGS. 4-6, if a GaN substrate is used instead of a sapphire substrate, laser de-bonding is not required. As a result, the glass 410 and thick epoxy 506, 606 sub-mount are not required.

After the LED structure is grown on GaN substrate, ITO 514 is deposited on the p-type GaN 504 and the backside of the GaN substrate, which is an N-face GaN, is etched with a wet etching, such as KOH and HCL. A cone-shaped surface 520, 622 is formed on the N-face GaN.

Also, when the surface of the ITO 514 is roughened, light extraction is increased through the ITO 514. Even without ITO 514 on the p-type GaN 504, the roughening of the surface of the p-type GaN 504 is effective to increase the light extraction through the p-type GaN 504.

In addition, an ohmic contact for the n-type GaN 512, ITO or ZnO may be used after the surface roughening 520 of the N-face GaN. ITO and ZnO 514 have a similar refractive index as GaN. As a result, the light reflection at the interface between ITO, ZnO 514 and GaN 504 is minimized.

FIG. 7A is a schematic illustrating an LED comprising an emitting layer 700, an n-type GaN layer 702, a p-type GaN layer 704, and an ITO layer 706, a second ITO layer 708, and glass 710. The GaN 702 of the LED has a roughened cone shaped surface 712 and the glass 710 has a roughened cone shaped surfaces 714. The LED is attached and wire bonded 716 to a lead frame or sub-mount 718 via the LED's bonding pads 720, 722. The LED is molded with epoxy or glass 724 as a sphere shape, for example, forming a lens. A remote phosphor layer 726, which may be roughened, is on the outside surface of the lens molding 724. FIG. 7B is a top view of the device in FIG. 7A showing a top view of the lead frame 718. The emitting layer 700 emits light 728 towards the surfaces 712 and 714 where the light can be extracted 730.

In FIG. 7A, the LED of FIG. 4A is molded with epoxy or glass 724 into the shape of a sphere. In this case, the LED can be considered a small spot light source, because the direction of all of the light emitted from the LED is substantially normal to the interface between air and the sphere 724, and the light therefrom is effectively extracted to air through the sphere molding 724.

In addition, a phosphor layer 726 may be placed on or near the outside surface of the molding 724. In this case, the conversion efficiency of the blue light to white light is increased due to reduced re-absorption of the LED light 728 resulting from reduced back scattering of the LED light 728 by the phosphor layer 726.

Also, when the surface 732 of the molding 724 or the surface 734 of the phosphor layer 726 is roughened, light extraction is increased through the molding 724 or the phosphor layer 726.

FIG. 8 is a schematic illustration of an LED comprising an emitting layer 800 (InGaN multi quantum wells), an n-type GaN layer 802, a p-type GaN layer 804, an ITO layer 806, roughened ITO surface 808, a bonding pad 810, an ohmic contact/bonding pad 812, roughened GaN surface 814, and an epoxy layer 816 on the roughened ITO surface 808. The LED is embedded in an epoxy molding 818 having a spherical shape, whose outer surface has a remote roughened phosphors layer 820.

In FIG. 8, the ITO or ZnO 806 is roughened to improve the light extraction through the ITO or ZnO 806. In addition, the epoxy 818 is sub-mounted. Otherwise, the structure of FIG. 8 is the same as that shown in FIGS. 5-7.

FIG. 9A is a schematic illustration of an LED comprising an emitting layer 900 (InGaN multi quantum wells), an n-type GaN layer 902, a p-type GaN layer 904, an ITO layer 906, bonding pad 908, an ohmic contact/bonding pad 910, roughened ITO surfaces 912, roughened GaN surface 914, and an epoxy layer 916 on the roughened ITO surface 912. The LED is embedded in an epoxy molding 918 having a spherical shape, whose outer surface has a remote roughened phosphors layer 920. The LED also includes a current spreading layer 922 (silicon dioxide, silicon nitride, or insulating layer, for example). The LED is attached and gold wire bonded 924 to a lead frame 926.

In FIG. 9A, before deposition of the ITO or ZnO 906, a current spreading layer 922 (such as SiO$_2$, SiN, or some other transparent insulating material) is deposited to flow the current uniformly through the p-type GaN 904. Otherwise, the structure of FIG. 9A is the same as that shown in FIG. 8.

FIG. 9B shows a top view of the lead frame 926.

FIG. 10 is a schematic illustration of an LED comprising an emitting layer 1000 (InGaN multi quantum wells), an n-type GaN layer 1002, a p-type GaN layer 1004, an ITO layer 1006, bonding pad 1008, an ohmic contact/bonding pad 1010, roughened ITO surface 1012, roughened GaN surface 1014, and an epoxy layer 1016 on the roughened ITO surface 1012. The LED is embedded in an epoxy molding 1018 having a spherical shape, whose outer surface has a remote roughened phosphors layer 1020. The LED also includes a current spreading layer 1022 (silicon dioxide, silicon nitride, or insulating layer, for example). The LED is attached and wire bonded 1024 to a lead frame 1026.

In FIG. 10, a mirror 1028 is placed outside of the sphere molding 1018 in order to obtain more light from the front side 1030 of the device. The shape of the mirror is designed to prevent reflected light from reaching the LED, in order to reduce re-absorption of the light by the LED.

Figure 11A:
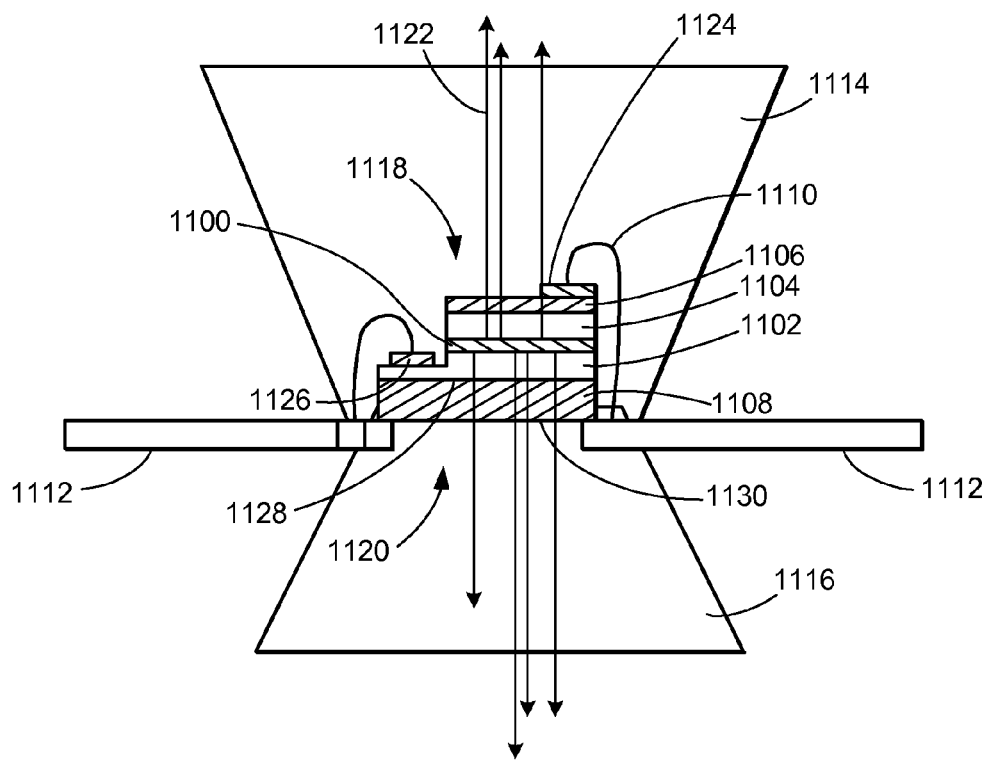

FIG. 11A is a schematic illustration of an LED comprising an emitting layer 1100, an n-GaN layer 1102, p-GaN layer 1104, ITO or ZnO layer 1106, and a sapphire substrate or patterned sapphire substrate 1108. The LED is attached and wire bonded 1110 to a lead frame 1112 and combined with in an epoxy or glass molding 1114, 1116 on the front 1118 and back sides 1120 of the LED. The emitting layer 1100 emits light 1122. The LED has bonding pads 1124, 1126.

In FIG. 11A, the LED structure is grown on a flat sapphire substrate or a patterned sapphire substrate (PSS) 1108 to improve the light extraction efficiency through the interface 1128 between the GaN 1102 and sapphire substrate 1108.

Also, the backside 1130 of the sapphire substrate 1108 is roughened to increase the light extraction from the sapphire substrate 1108 to air, epoxy or glass. The best shape of the roughened surface 1130 is a cone-shaped surface.

ITO or ZnO 1106 is deposited on the p-type GaN 1104. A bonding pad 1124 may be deposited on the ITO or ZnO 1106, and an ohmic contact/bonding pad 1126 may be deposited on the n-type GaN 1102, after exposing the n-type GaN 1102 by a selective etching through the p-type GaN 1104.

The LED may be combined with epoxy or glass and molded as an inverted cone-shapes 1114, 1116 for both the front 1118 and back sides 1120, wherein the inverted cone shapes 1114, 1116 provides enhanced light extraction. Specifically, most of the light entering the inverted cone shapes 1114, 1116 lies within a critical angle and is extracted. The light is reflected to a top or emitting surface of the inverted cone shape 1114 by the side walls of the inverted cone shape 1114 for emission through the top surface of the inverted cone shape 1114, and similarly, the light is reflected to a bottom or emitting surface of the inverted cone shape 1116 by the side walls of the inverted cone shape 1116 for emission through the bottom surface of the inverted cone shape 1114.

Figure 11B:
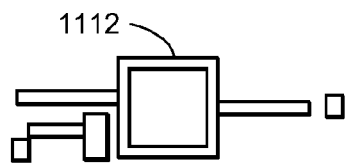

FIG. 11B shows a top view of the lead frame 1112.

Figure 12:
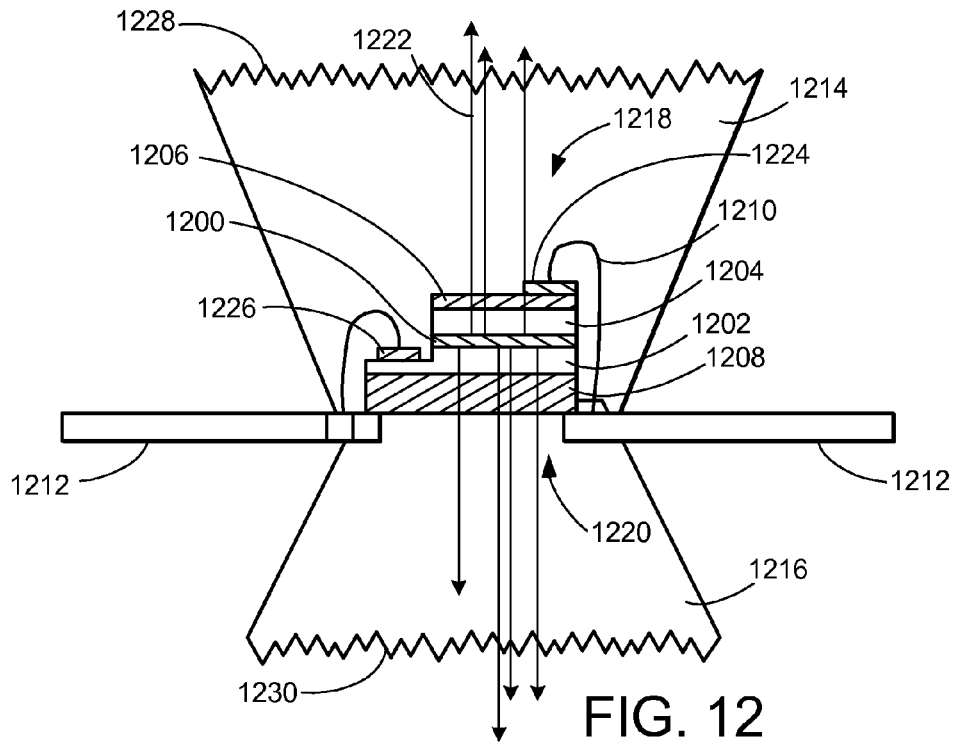

FIG. 12 is a schematic illustration of an LED comprising an emitting layer 1200, an n-GaN layer 1202, p-GaN layer 1204, ITO or ZnO layer, 1206, and a sapphire substrate or patterned sapphire substrate 1208. The LED is attached and wire bonded 1210 to a lead frame 1212 and combined with in an epoxy or glass molding 1214, 1216 on the front 1218 and back sides 1220 of the LED. The emitting layer 1200 emits LED light 1222. The LED has bonding pads 1224, 1226.

In FIG. 12, the top surface 1228, 1230 of the inverted cone shape molding 1214, 1216 is roughened to increase the light extraction through the molding 1214, 1216.

Figure 13:
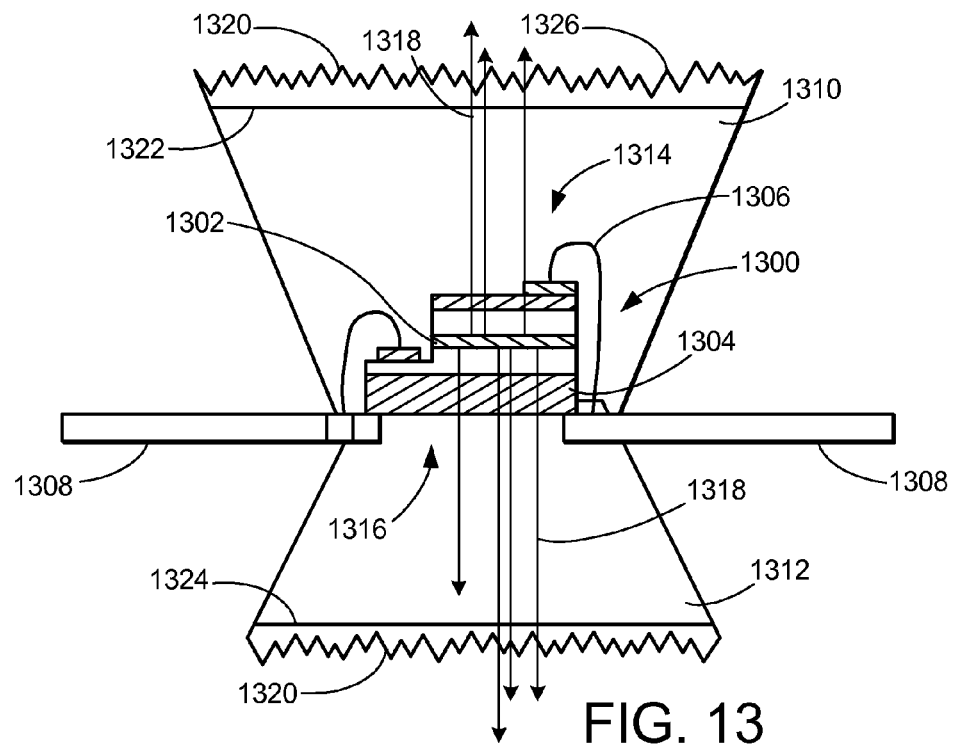

FIG. 13 is a schematic illustration of an LED 1300 comprising an emitting layer 1302 and a sapphire substrate or patterned sapphire substrate 1304. The LED 1300 is attached and wire bonded 1306 to a lead frame 1308 and combined with in an epoxy or glass molding 1310, 1312 on the front 1314 and back sides 1316 of the LED 1300. The emitting layer 1302 emits LED light 1318.

In FIG. 13, a phosphor layer 1320 is placed near the top surface 1322, 1324 of the molding 1310, 1312. Preferably, the phosphor layer 1320 should be placed far away from the LED 1300. In this case, the conversion efficiency of the blue light to white light is increased, due to reduced re-absorption of the LED 1300 light resulting from reduced back-scattering of the light by the phosphor 1320 to the LED 1300.

The surface 1326 of the phosphor layer 1320 is roughened to improve the light extraction through the phosphor 1320.

Figure 14A:
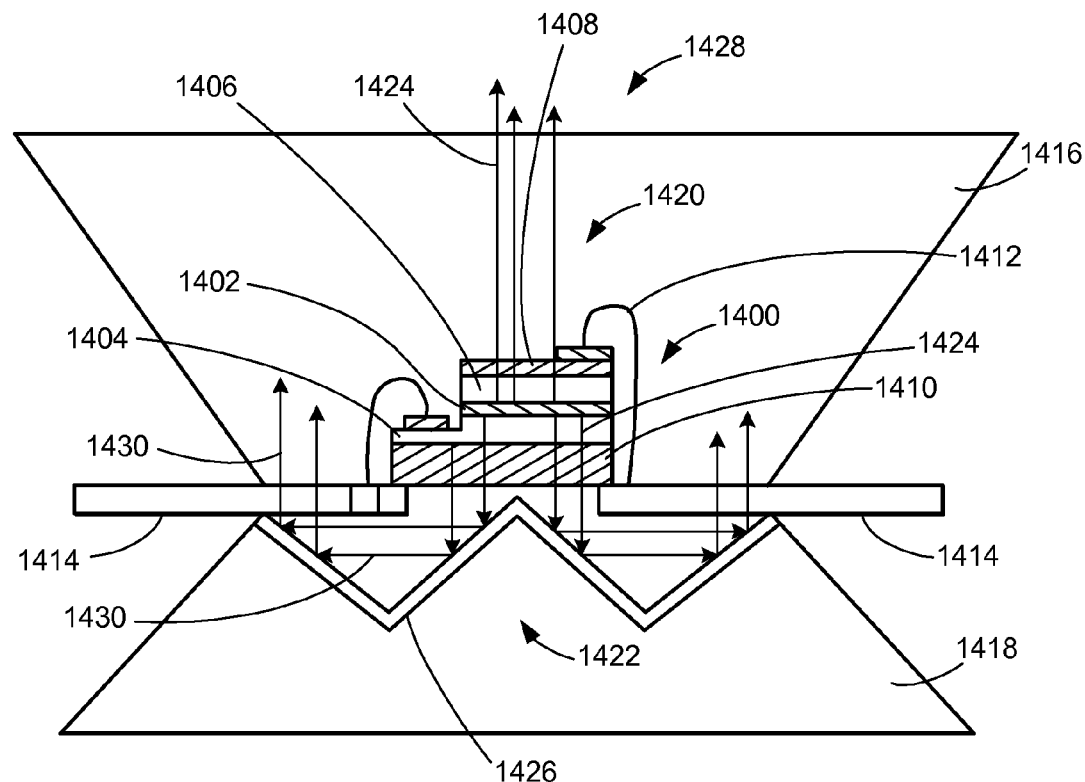

FIG. 14A is a schematic illustration of an LED 1400 comprising an emitting layer 1402, an n-GaN layer 1404, p-GaN layer 1406, ITO or ZnO layer 1408, and a sapphire substrate or patterned sapphire substrate 1410. The LED 1400 is attached and wire bonded 1412 to a lead frame 1414 and combined with in an epoxy or glass molding 1416, 1418 on the front 1420 and back sides 1422 of the LED 1400. The emitting layer 1402 emits light 1424.

Figure 14B:
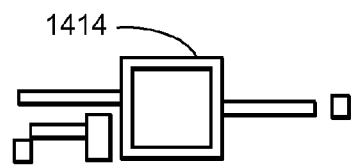

FIG. 14B is a schematic illustration showing the top view of the lead frame 1414.

In FIG. 14A, a mirror 1426 is placed inside the molding 1418 to increase the light output to the front side 1428 of the device. The shape of the mirror 1426 is designed to prevent any reflected light 1430 (the reflected light 1430 is reflected LED light 1424) from reaching the LED 1400, where it would be re-absorbed by the LED 1400, which reduces the output power or the efficiency of the LED.

In this case, a mirror 1426 is partially attached to the LED 1400 or the substrate 1410. This partial attachment of the mirror 1426 is different from an attached mirror of a conventional LED, because the attached mirror of the conventional LED is attached to the whole surface of the LED, at either the front or the back sides of the LED, as shown in FIGS. 1-3.

Figure 15:
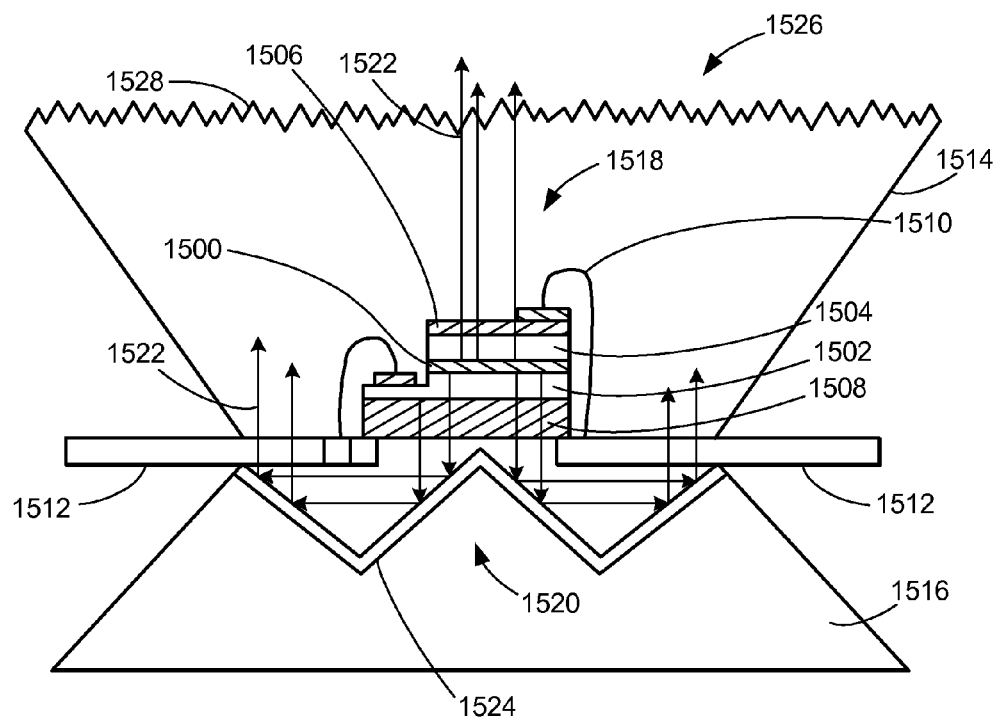

FIG. 15 is a schematic illustration of an LED comprising an emitting layer 1500, an n-GaN layer 1502, p-GaN layer 1504, ITO or ZnO layer 1506, and a sapphire substrate or patterned sapphire substrate 1508. The LED is attached and wire bonded 1510 to a lead frame 1512 and combined with in an epoxy or glass molding 1514, 1516 on the front 1518 and back sides 1520 of the LED. The emitting layer 1500 emits LED light 1522. A mirror 1524 is placed inside the molding 1516 to increase the light output to the front side 1526 of the device.

In FIG. 15, the top surface 1528 of the molding 1514 is roughened to improve the light extraction efficiency.

Figure 16:
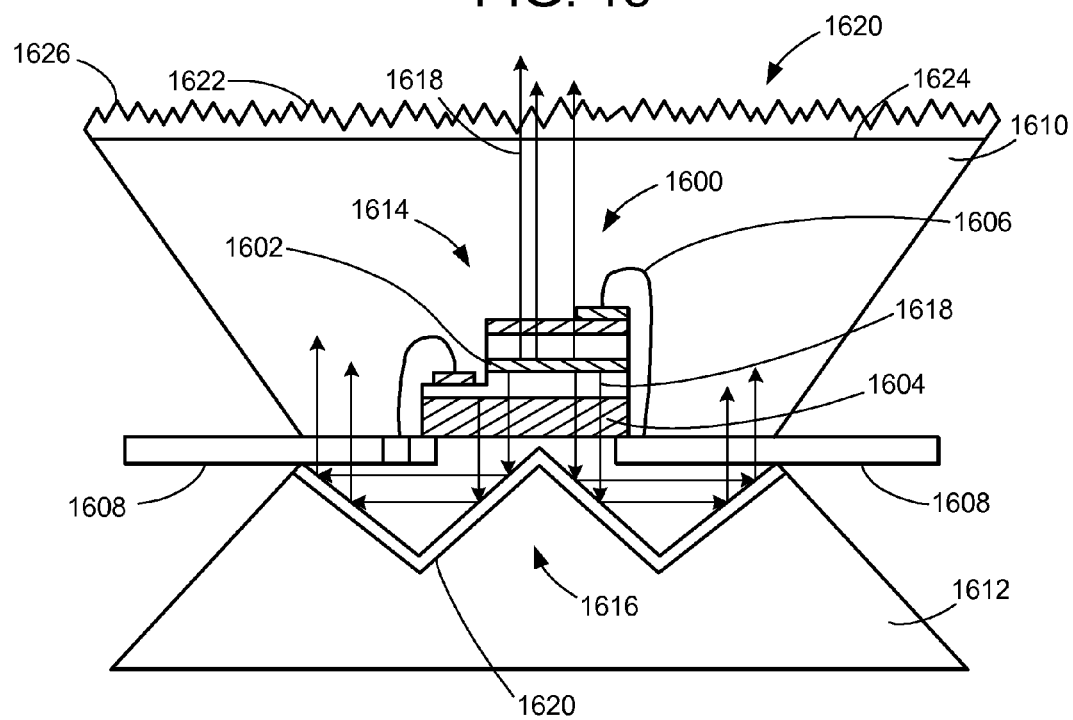

FIG. 16 is a schematic illustration of an LED 1600 comprising an emitting layer 1602 and a sapphire substrate or patterned sapphire substrate 1604. The LED 1600 is attached and wire bonded 1606 to a lead frame 1608 and combined with in an epoxy or glass molding 1610, 1612 on the front 1614 and back sides 1616 of the LED 1600. The emitting layer 1602 emits light 1618. A mirror 1620 is placed inside the molding 1612 to increase the light output to the front side 1620 of the device.

In FIG. 16, a phosphor layer 1622 is placed near the top surface 1624 of the molding 1610. Preferably, the phosphor layer 1622 should be placed far away from the LED 1600. In this case, the conversion efficiency of the blue light to white light is increased, due to reduced re-absorption of the LED light 1618 resulting from reduced back-scattering by the phosphor 1622. In addition, the surface 1626 of the phosphor layer 1622 is roughened to improve the light extraction through the phosphor 1622.

FIG. 17A is a schematic illustration of an LED 1700 comprising an emitting layer 1702 and a sapphire substrate or patterned sapphire substrate 1704. The LED is attached and wire bonded 1706 to a lead frame 1708 and embedded in an epoxy or glass molding 1710. The emitting layer 1700 emits LED light 1712. Mirrors 1714 are placed inside the molding 1710 to increase the light output to the front side 1716 of the device by reflecting the light 1710 to form reflected light 1720 away from the backside 1718 of the device.

In FIG. 17A, mirrors 1714 are embedded within the molding 1710 and the molding 1710 is rotated relative to the lead frame 1708 and LED 1700, resulting the LED light 1712 being emitted from the direction of side wall 1722 of the LED 1700 through the front side 1716 of the molding 1710.

FIG. 17B is an illustration showing the top view of the lead frame 1708.

FIG. 18A is a schematic illustration of an LED 1800 comprising an emitting layer 1802 and a sapphire substrate or patterned sapphire substrate 1804. The LED 1800 is attached and wire bonded 1806 to a lead frame 1808 and embedded in an epoxy or glass molding 1810. The emitting layer 1802 emits LED light 1812. Mirrors 1814 increase the light output to the front side 1816 of the device by reflecting LED light 1812 to form reflected light 1818 (away from the backside 1820 of the device).

FIG. 18B is an illustration showing the top view of the lead frame 1808.

In FIG. 18A, the molding is an inverted cone shape 1810 rotated relative to the lead frame 1808 and LED 1800, wherein mirrors 1814 have been deposited or attached to the sides 1822 of the inverted cone shape 1810.

The angle 1824 of the inverted cone shape 1810 reflects LED light 1812 emitted from the LED 1800 to the front side 1816 of the inverted cone shape 1810. For example, the refractive index of epoxy is $n_2=1.5$. The refractive index of the air is $n_1=1$. As a result, the critical angle of the reflection is $\sin^{-1}(1/1.5)$. Therefore, the angle of the inverted cone shape 1822 should be more than $\sin^{-1}(1/1.5)$. This results in the LED light being effectively extracted from the top surface 1828 of the inverted cone or from the direction of the side wall 1826 of the LED 1800.

Figures 19A, 19B:
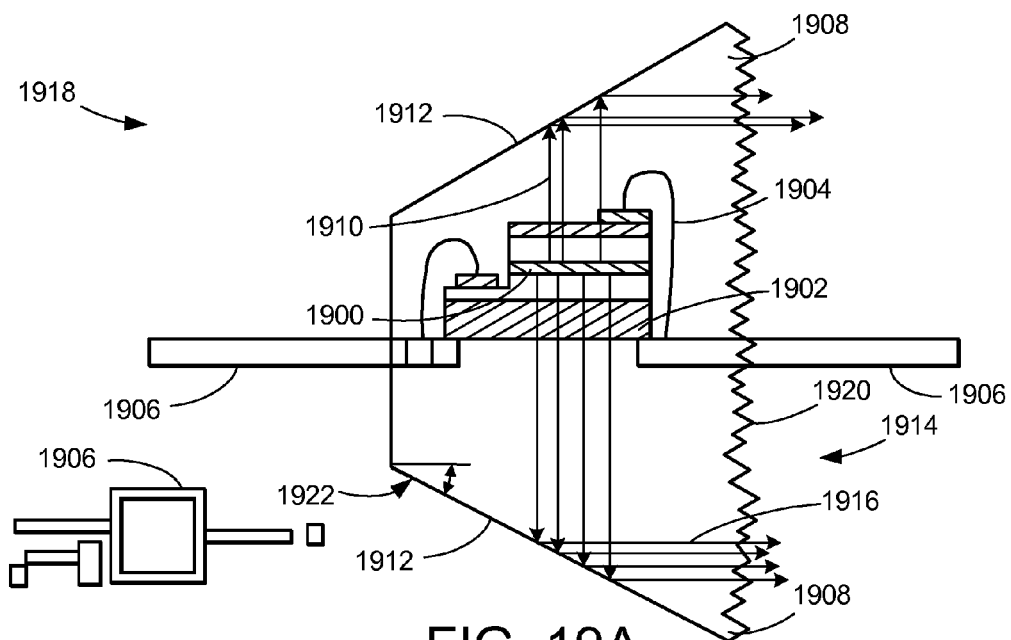

FIG. 19A is a schematic illustration of an LED comprising an emitting layer 1900 and a sapphire substrate or patterned sapphire substrate 1902. The LED is attached and wire bonded 1904 to a lead frame 1906 and embedded in an epoxy or glass molding 1908. The emitting layer 1900 emits light 1910. Mirrors 1912 increase the light output to the front side 1914 of the device by reflecting LED light 1910 to form reflected light 1916 (away from the backside 1918).

FIG. 19B is a top view of the lead frame 1906.

In FIG. 19A, the front surface 1920 of the inverted cone shape molding 1908 is roughened to increase the light extraction through the molding 1908. The molding has an angle of the inverted cone 1922.

Figures 20A, 20B:
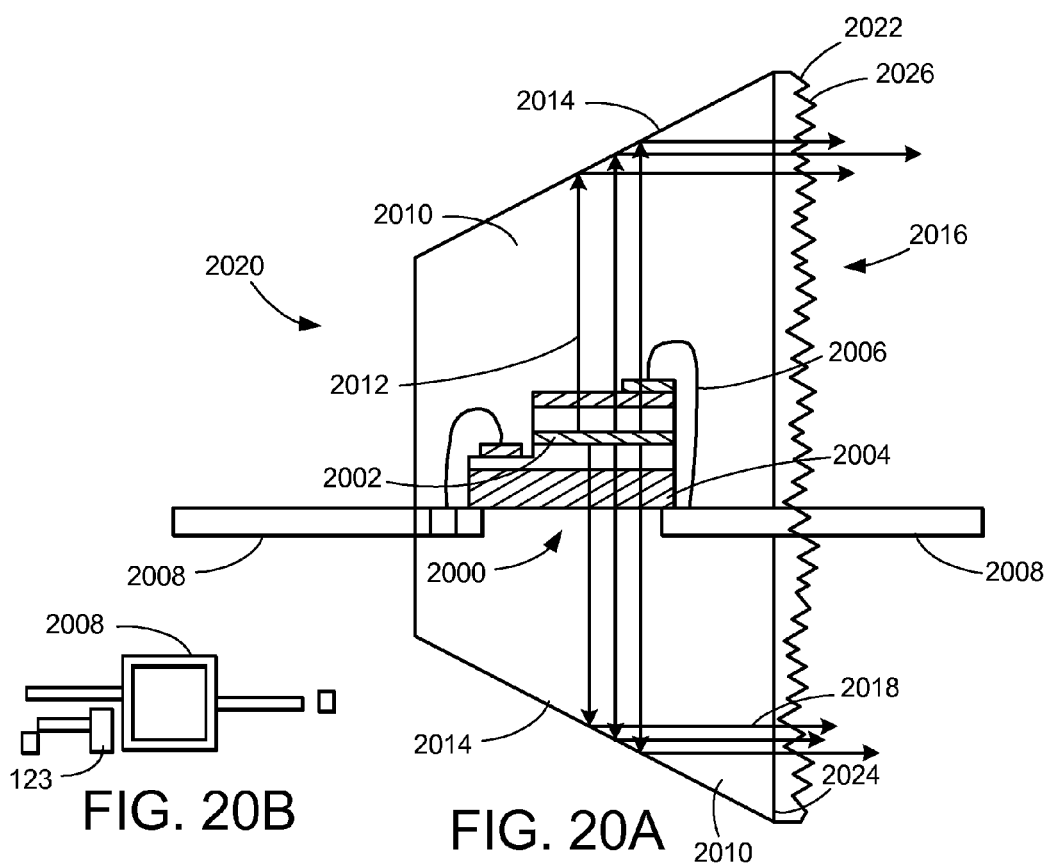

FIG. 20A is a schematic illustration of an LED 2000 comprising an emitting layer 2002 and a sapphire substrate or patterned sapphire substrate 2004. The LED 2000 is attached and wire bonded 2006 to a lead frame 2008 and embedded in an epoxy or glass molding 2010. The emitting layer 2002 emits light 2012. Mirrors 2014 increase the light output to the front side 2016 of the device by reflecting LED light 2012 to form reflected LED light 2018 (away from the backside 2020).

In FIG. 20A, a phosphor layer 2022 is placed near the top surface 2024 of the inverted cone shape molding 2010. Preferably, the phosphor layer 2022 should be placed far away from the LED 2000. In this case, the conversion efficiency of the blue light to white light is increased, due to reduced re-absorption of the LED light 2012 resulting from reduced back-scattering by the phosphor 2022. In addition, the surface 2026 of the phosphor layer 2022 is roughened to improve the light extraction through the phosphor 2022.

FIG. 20B shows a top view of the lead frame 2008.

Figure 21A:
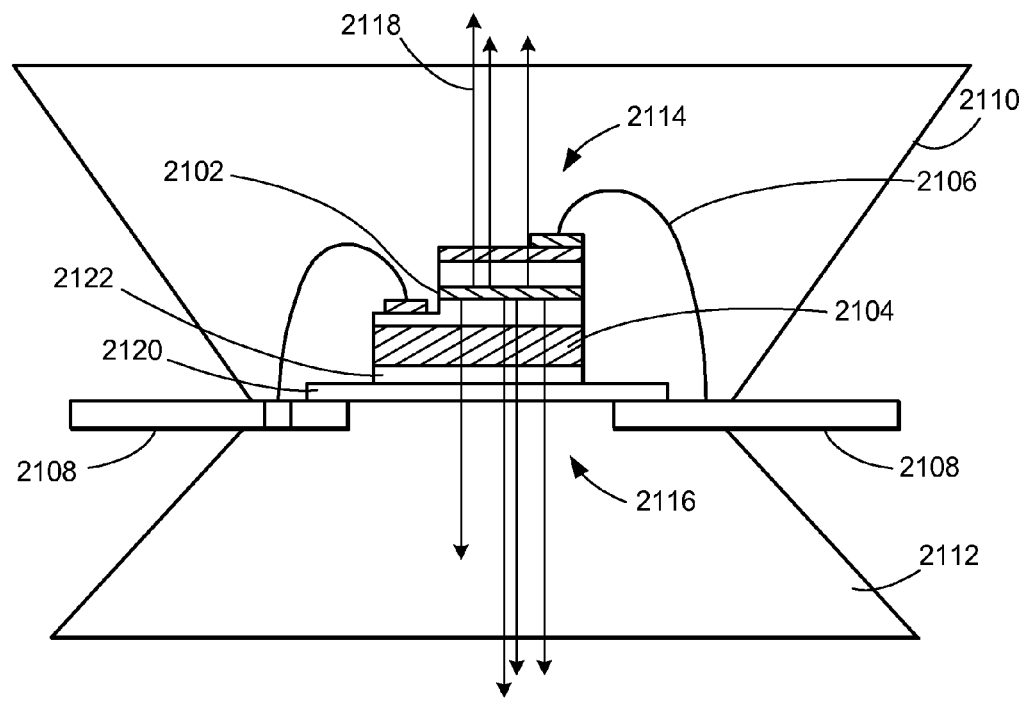

FIG. 21A is a schematic illustration of an LED comprising an emitting layer 2102 and a sapphire substrate or patterned sapphire substrate 2104. The LED is attached and wire bonded 2106 to a lead frame 2108 and combined with in an epoxy or glass molding 2110, 2112 on the front 2114 and back sides 2116 of the LED. The emitting layer 2102 emits LED light 2118.

In FIG. 21A, a lead frame 2108 is used where the LED is placed on a transparent plate 2120, such as glass, quartz, sapphire, diamond or other transparent materials for the emission wavelength, using a transparent/clear epoxy 2122 as a die-bonding material. The transparent glass plate 2120 effectively extracts the LED light 2118 to the epoxy molding 2110.

Figure 21B:
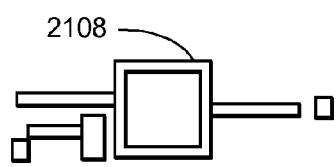

FIG. 21B shows a top view of the lead frame 2108.

FIG. 22A illustrates an LED structure comprising an n-type GaN layer 2200, p-type GaN layer 2202, active layer 2204, bulk substrate 2206, transparent contact 2208, and n-type electrode 2210. In FIG. 22A, the front side 2212 of the LED is textured into cones 2214 to enhance light extraction 2216 of LED emissions 2218.

FIG. 23A illustrates an LED structure 2300, on a bulk GaN substrate 2302, having a transparent contact or transparent conducting electrode 2304, a p-contact 2306, and an n-contact 2308. In FIG. 23A, the backside side of substrate 2302 is textured into cones 2310 (textured surface).

FIGS. 22A and 23A both illustrate LED structures grown using a bulk GaN, ZnO, SiC, Spinel or other transparent material substrate, wherein the substrate may be shaped, patterned, textured or roughened. FIG. 22B is an image of the textured surface 2214 of the substrate 2206 and FIG. 23B is an image of the textured surface 2310 of the substrate 2302.

Figures 24A, 24B:
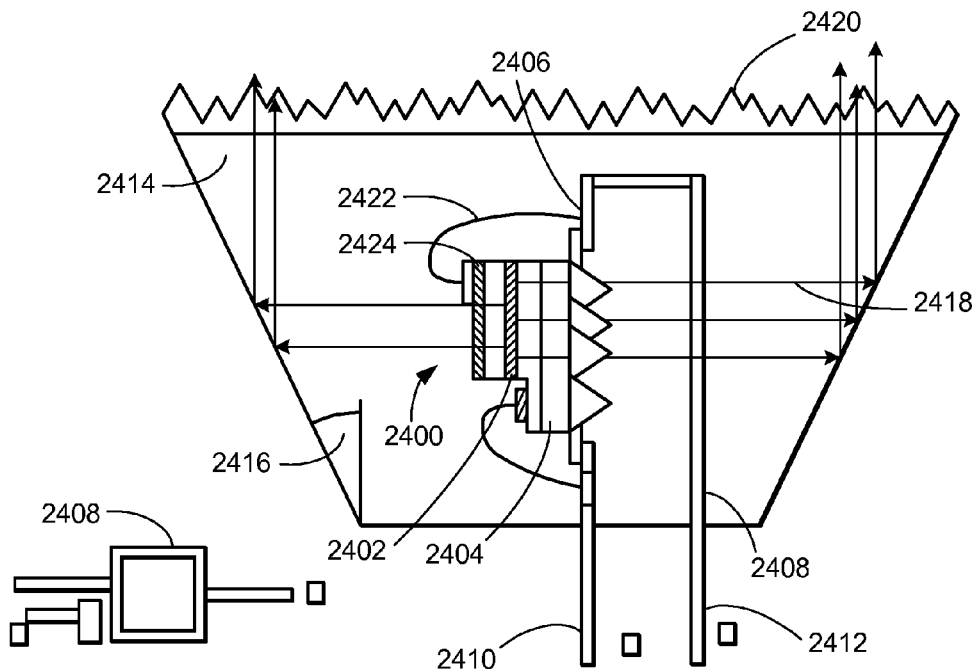
FIG. 24 is a cross-sectional schematic illustration of an LED structure grown using a patterned sapphire substrate or textured GaN, ZnO, SiC, Spinel or other transparent material substrate.

FIG. 24A shows an LED 2400 including an emitting layer 2402 and a sapphire substrate or patterned sapphire substrate (PSS) 2404. The LED 2400 sits on a transparent glass plate 2406 attached to a metal lead frame 2408 having electrodes 2410 and 2412. The LED 2400 is embedded in an inverted cone 2414 made or epoxy or glass, having an angle 2416. The emitting layer 2402 emits LED light 2418 which is reflected by the inverted cone 2414 out of the front surface 2420. The LED 2400 is wire bonded 2422 to the metal lead frame 2408. The LED 2400 also has a transparent contact layer 2424 (for example, ITO or ZnO).

FIG. 24B shows a top view of the lead frame 2408 and inverted cone made of glass 2414.

FIG. 24 is a schematic illustration of an LED structure grown using a patterned sapphire substrate or textured GaN, ZnO, SiC, Spinel, or other transparent material substrate. Note that the substrate may be wherein the substrate may be shaped, patterned, textured or roughened 2426.

Figures 25A, 25B:
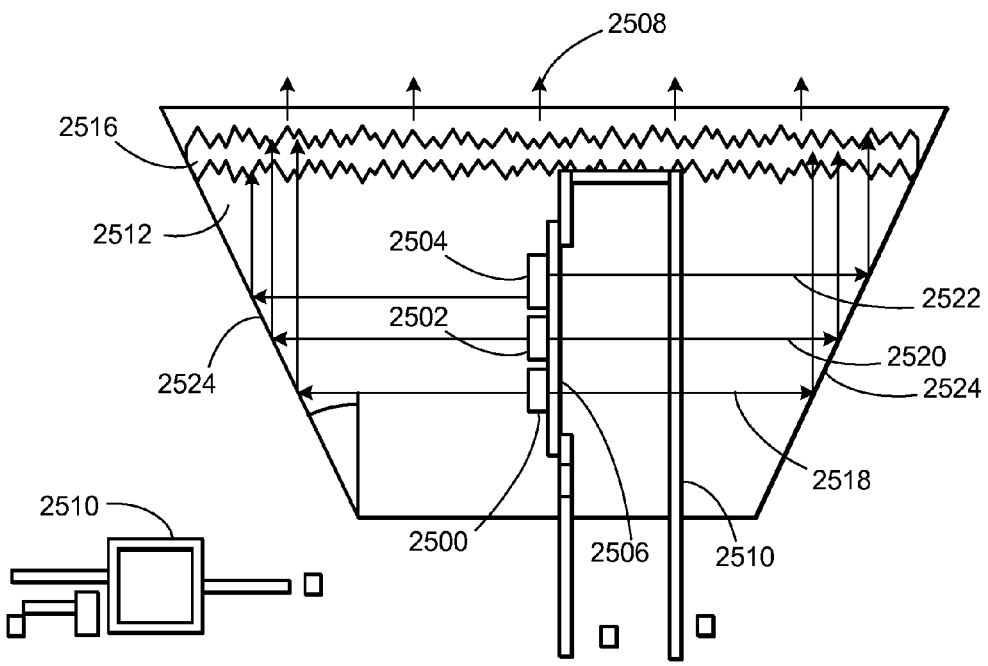
FIG. 25 is a cross-sectional schematic illustration of an LED structure that includes blue, green and red LEDs.

FIG. 25A is a schematic illustration of an LED structure that includes blue 2500, green 2502 and red 2504 LEDs or LED emitting layers that are placed on the transparent plate 2506, in order to make white LED light 2508 from the three primary color LEDs 2500, 2502 and 2504. The transparent plate 2506 (e.g. glass) sits on a metal lead frame 2510. The LEDs are embedded in a molding material such as an inverted cone made of epoxy or glass 2512 having an angle 2514, wherein the inverted cone 2512 contains a light mixing layer 2516. The blue 2518, green 2520 and red 2522 light emitted by the emitting layers 2500, 2502 and 2504 is reflected by the surfaces 2524 towards the light mixing layer 2516 which layer 2516 mixes the blue 2518, green 2520 and red 2522 light to create the white light 2508 extracted from the inverted cone 2512.

Preferably, the number of blue, green and red LED chips are adjusted to make an optimum white light LED. A light mixing layer may be placed inside of the molding material in order to create the white light by mixing three primary colors of light. The light mixing layer my also perform a uniform diffusion of the mixing light, i.e., the light diffusion layer is put inside of the molding material to diffuse the light uniformly.

Advantages and Improvements

Without any intentional mirrors attached to LED chip (where a mirror coated on the lead frame is also considered an intentional mirror), the re-absorption of LED light is minimized and the light extraction efficiency is increased dramatically. Then, the light output power of the LEDs is increased dramatically.

The combination of a transparent oxide electrode with a surface roughened nitride LED and shaped optical element acting as a lens results in high light extraction.

REFERENCES

The following references are incorporated by reference herein:

1. Appl. Phys. Lett. 56, 737-39 (1990).
2. Appl. Phys. Lett. 64, 2839-41 (1994).
3. Appl. Phys. Lett. 81, 3152-54 (2002).
4. Jpn. J. Appl. Phys. 43, L1275-77 (2004).
5. Jpn. J. Appl. Physics, 45, No. 41, L1084-L1086 (2006).
6. Fujii T., Gao Y., Sharma R., Hu E. L., DenBaars S. P., Nakamura S., "Increase in the extraction efficiency of GaN-based light-emitting diodes via surface roughening," Applied Physics Letters, vol. 84, no. 6, 9 Feb. 2004, pp. 855-7.
7. J. J. Appl. Phys. 34, L797-99 (1995).
8. J. J. Appl. Phys. 43, L180-82 (2004).

CONCLUSION

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching.

What is claimed is:

1. An opto-electronic device, comprising:
a light emitting diode (LED) that emits light out of the LED from multiple sides of the LED, wherein all layers of the LED are transparent for an emission wavelength except for an emitting layer.

2. The opto-electronic device of claim 1, wherein the light is emitted out of the LED from front and back sides of the LED.

3. The opto-electronic device of claim 1, wherein one or more layers of the LED are shaped, patterned, textured or roughened to increase the light extraction.

4. The opto-electronic device of claim 1, wherein the LED is comprised of multiple emitting layers of multiple wavelengths to generate light of a broader spectral range.

5. The opto-electronic device of claim 1, wherein the substrate is shaped, patterned, textured or roughened to increase the light extraction.

6. The opto-electronic device of claim 1, wherein the LED resides in a lead frame that allows the light to be extracted from two or more sides of the LED.

7. The opto-electronic device of claim 1, wherein the LED includes a transparent substrate.

8. The opto-electronic device of claim 7, wherein the transparent substrate is electrically conductive.

9. The opto-electronic device of claim 1, wherein the LED includes one or more transparent contact layers.

10. The opto-electronic device of claim 9, wherein the transparent contact layer is shaped, patterned, textured or roughened to increase the light extraction.

11. The opto-electronic device of claim 9, wherein a current spreading layer is deposited on the LED before the transparent contact layer.

12. The opto-electronic device of claim 1, wherein the LED is embedded within a shaped optical element.

13. The opto-electronic device of claim 12, wherein the shaped optical element is a molding.

14. The opto-electronic device of claim 13, wherein the shaped optical element is shaped, patterned, textured or roughened to increase the light extraction.

15. The opto-electronic device of claim 12, wherein the shaped optical element is comprised of transparent materials.

16. The opto-electronic device of claim 12, wherein the shaped optical element is an inverted cone shape.

17. The opto-electronic device of claim 12, wherein a mirror is placed inside the shaped optical element.

18. The opto-electronic device of claim 12, wherein a phosphor layer is located on top of the shaped optical element, within the shaped optical element or near a surface of the shaped optical element.

19. The opto-electronic device of claim 18, wherein the phosphor layer is shaped, patterned, textured or roughened to increase the light extraction.

20. The opto-electronic device of claim 12, wherein the shaped optical element is a sphere shape.

21. An opto-electronic device comprising:
a light emitting diode (LED) that emits light out of the LED from multiple sides of the LED, wherein the LED is embedded within a shaped optical element, the shaped optical element is an inverted cone shape, and the light is reflected to a front surface of the inverted cone shape by side walls of the inverted cone shape positioned at a critical angle, so that the light is emitted through the front surface of the inverted cone shape.

22. The opto-electronic device of claim 21, wherein the shaped optical element is a molding.

23. The opto-electronic device of claim 21, wherein the shaped optical element is shaped, patterned, textured or roughened to increase the light extraction.

24. The opto-electronic device of claim 17, wherein the shaped optical element is comprised of transparent materials.

25. The opto-electronic device of claim 21, wherein a mirror is placed inside the shaped optical element.

26. The opto-electronic device of claim 21, wherein a phosphor layer is located on top of the shaped optical element, within the shaped optical element or near a surface of the shaped optical element.

27. The opto-electronic device of claim 26, wherein the phosphor layer is shaped, patterned, textured or roughened to increase the light extraction.

28. An opto-electronic device, comprising:
a light emitting diode (LED) that emits light out of the LED from multiple sides of the LED, wherein the LED resides on a transparent plate in a lead frame that allows the light to be extracted from two or more sides of the LED.

29. A method of fabricating an opto-electronic device, comprising:
creating a light emitting diode (LED) that emits light out of the LED from multiple sides of the LED, wherein all layers of the LED are transparent for an emission wavelength except for an emitting layer.

30. The method of claim 29, wherein the light is emitted out of the LED from front and back sides of the LED.

31. The method of claim 29, wherein one or more layers of the LED are shaped, patterned, textured or roughened to increase the light extraction.

32. The method of claim 29, wherein the LED is comprised of multiple emitting layers of multiple wavelengths to generate light of a broader spectral range.

33. The method of claim 29, wherein the substrate is shaped, patterned, textured or roughened to increase the light extraction.

34. The method of claim 29, wherein the LED resides in a lead frame that allows the light to be extracted from two or more sides of the LED.

35. The method of claim 29, wherein the LED includes a transparent substrate.

36. The method of claim 35, wherein the transparent substrate is electrically conductive.

37. The method of claim 29, wherein the LED includes one or more transparent contact layers.

38. The method of claim 37, wherein the transparent contact layer is shaped, patterned, textured or roughened to increase the light extraction.

39. The method of claim 37, wherein a current spreading layer is deposited on the LED before the transparent contact layer.

40. The method of claim 29, wherein the LED is embedded within a shaped optical element.

41. The method of claim 40, wherein the shaped optical element is a molding.

42. The method of claim 41, wherein the shaped optical element is shaped, patterned, textured or roughened to increase the light extraction.

43. The method of claim 40, wherein the shaped optical element is comprised of transparent materials.

44. The method of claim 40, wherein the shaped optical element is a sphere shape.

45. The method of claim 40, wherein the shaped optical element is an inverted cone shape.

46. The method of claim 40, wherein a mirror is placed inside the shaped optical element.

47. The method of claim 40, wherein a phosphor layer is located on top of the shaped optical element, within the shaped optical element or near a surface of the shaped optical element.

48. The method of claim 47, wherein the phosphor layer is shaped, patterned, textured or roughened to increase the light extraction.

49. A method of fabricating an opto-electronic device, comprising:
creating a light emitting diode (LED) that emits light out of the LED from multiple sides of the LED, wherein the LED is embedded within a shaped optical element, the shaped optical element is an inverted cone shape, and the light is reflected to a front surface of the inverted cone shape by side walls of the inverted cone shape positioned at a critical angle, so that the light is emitted through the front surface of the inverted cone shape.

50. The method of claim 49, wherein the shaped optical element is a molding.

51. The method of claim 49, wherein the shaped optical element is shaped, patterned, textured or roughened to increase the light extraction.

52. The method of claim 49, wherein the shaped optical element is comprised of transparent materials.

53. The method of claim 49, wherein a mirror is placed inside the shaped optical element.

54. The method of claim 49, wherein a phosphor layer is located on top of the shaped optical element, within the shaped optical element or near a surface of the shaped optical element.

55. The method of claim 54, wherein the phosphor layer is shaped, patterned, textured or roughened to increase the light extraction.

56. A method of of fabricating an opto-electronic device, comprising:
creating a light emitting diode (LED) that emits light out of the LED from multiple sides of the LED, wherein the LED resides on a transparent plate in a lead frame that allows the light to be extracted from two or more sides of the LED.

* * * * *